United States Patent [19]

Miyoshi et al.

[11] Patent Number: 4,683,590
[45] Date of Patent: Jul. 28, 1987

[54] INVERSE CONTROL SYSTEM

[75] Inventors: Masato Miyoshi, Tokorozawa; Yutaka Kaneda, Tanashi; Juro Ohga, Kamakura, all of Japan

[73] Assignee: Nippon Telegraph and Telphone Corporation, Tokyo, Japan

[21] Appl. No.: 839,677

[22] Filed: Mar. 14, 1986

[30] Foreign Application Priority Data

Mar. 18, 1985 [JP] Japan ............................ 60-53886
Feb. 17, 1986 [JP] Japan ............................ 61-32659

[51] Int. Cl.$^4$ ............... H04B 15/00; G10K 11/16; G11B 3/00
[52] U.S. Cl. ............... 381/71; 381/94; 381/83; 381/93; 381/66
[58] Field of Search .......... 381/71, 73, 92, 93, 381/94, 95, 96, 97, 83, 66

[56] References Cited

U.S. PATENT DOCUMENTS

| | | | |
|---|---|---|---|
| 4,493,101 | 1/1985 | Muraoka | 381/93 |
| 4,536,887 | 8/1985 | Kaneda | 381/94 |
| 4,589,137 | 5/1986 | Miller | 381/94 |
| 4,596,033 | 6/1986 | Swinbans | 381/71 |
| 4,622,660 | 11/1986 | Cowans | 381/94 |

*Primary Examiner*—Gene Z. Rubinson
*Assistant Examiner*—L. C. Schroeder
*Attorney, Agent, or Firm*—Polock, Vande Sande and Priddy

[57] ABSTRACT

An inverse control system is disclosed, which comprises FIR filters provided between transmitting elements at n (n=2, 3, ... ) input points of a linear FIR system and a common signal source, for an inverse control such as to provide desired impulse responses between the signal source and m (n>m) output points of the linear FIR system. A j-th (j=1, 2, ..., n) one of the FIR filters has a number $L_j$ of taps which satisfies the relationships represented by $$\sum_{s=1}^{n} L_s \geq \sum_{t=1}^{m} (w_{ij} + L_j - 1)$$

$$w_{ij} + L_j - 1 \geq P_i$$

for all i=1, 2, ..., m and j=1, 2 ..., n where $w_{ij}$ is the number of discrete signals representing the impulse response $g_{ij}(k)$ between the j-th output point and i-output point and $P_i$ is the number of discrete signals representing the desired impulse response $r_i(k)$ between the signal source and i-th output point. The j-th FIR filters has a filter coefficient $h_j(k)$ satisfying the relationship $$r_i(k) = \sum_{j=1}^{n} g_{ij}(k) * h_j(k) \text{ for all } i = 1, 2, \ldots, m$$

where * is a discrete convolution.

25 Claims, 19 Drawing Figures

INVERSE CONTROL SYSTEM

BACKGROUND OF THE INVENTION

1. Field of the Invention

This invention relates to an inverse control system, which is used in cascade connection to a linear system having one or more input points and one or more output points, with the impulse responses of signal transmission channels between any such input and output points being substantially finite (the linear system being hereinafter referred to as linear FIR (finite impulse response) system), for realizing an inverse control of the linear FIR system such as to make its impulse response, or signal transmission characteristics (i.e., frequency versus amplitude characteristics and frequency versus phase characteristics) of the linear FIR system to be desired impulse responses (signal transmission characteristics).

The inverse control system of a linear FIR system can be applied to various fields. For example, it can be applied to a loudspeaker-system. In this case, inverse control of input-signals to the loudspeaker-system can be utilized for realizing a desired sound pressure distribution at one or more microphones or at a person's ears in a sound field in an ordinary room. Also, it can be utilized for suppressing the howling phenomenon by removing the acoustical coupling between loudspeakers and microphones. Further application is the active noise control for suppressing room noise at desired points in a room.

The inverse control system can also be applied to a microphone-system. In this case, inverse control of output-signals of the microphone-system can be utilized for dereverberation of acoustic signals which radiate in a room, and for suppressing undesired acoustic signals (i.e. room noise etc.) which pollute a desired acoustic signal.

Further, where the linear FIR system is an electromagnetic wave propagation system, inverse control can be utilized for processing an input signal supplied to transmitting antennas to obtain distortionless transmission such that a distortionless signal can be received at a receiving point in the electromagnetic wave propagation system. Inverse control can also be utilized for processing intercepted signals by receiving antennas to remove multi-path, ghost and noise signals.

2. Prior Art

FIG. 1 shows a prior art method for controlling the sound pressure at a single point for the sake of the brevity. A method for control of two or more points is based on entirely the same principle. It is assumed that the sound pressure from a virtual loudspeaker S' that is received by a microphone 11, which is disposed in a sound field 40 where there are reverberations, can be reproduced without using the virtual loudspeaker S' by using a loudspeaker $1_1$ disposed at a different position. If this can be done, the result is the same as if an acoustic signal were being radiated from the virtual loudspeaker S' in spite of the fact that the acoustic signal is actually being radiated from the loudspeaker $1_1$. To produce this situation, coefficients of a filter $21_1$ through which a signal is supplied to the loudspeaker $1_1$, may be suitably set such that the impulse response of a channel between the loudspeaker $1_1$ and microphone $11_1$ is equal to that of a channel between the virtual loudspeaker S' and microphone $11_1$. That is, the signal may be inversely controlled through the filter $21_1$.

In FIG. 1, the sound field 40 in the room can be regarded as a linear FIR system, with the loudspeaker $1_1$ acting at an input point of the system as a transmitting element for supplying a signal to the system and the microphone $11_1$ acting at an output point of the system as a receiving element.

Usually, therefore, an arrangement as shown in FIG. 2 is set up. A transmitting element $4_1$ is disposed at an input point $3_1$ of a single-input single-output linear FIR system. A signal from the transmitting element $4_1$ is fed to the linear FIR system $2_1$. A signal from a signal source 13 is fed through a filter $21_1$ to the transmitting element $4_1$. An output signal which has characteristic corresponding to a desired impulse response, is obtained from an output point $5_1$ of the linear FIR system $2_1$.

To simplify the description, inverse control of the linear FIR system $2_1$ will be considered, in which an input signal $x(k)$ ($K=1, 2, \ldots$) from the signal source 13 and the output signal $y(k)$ of the linear FIR system $2_1$ are made equal on the premise that there would be no delay (i.e., delay time of the impulse response) in the linear system $2_1$. In FIG. 2, the relationship between the input signal and the output signal $y(k)$ is given by the following expression (1a)

$$y(k) = h_1(k) \circledast g_{11}(k) \circledast x(k) \tag{1a}$$

wherein $h_1(k)$ denotes coefficients of the filter $21_1$ and $g_{11}(k)$ is an impulse response represented by $W_{11}$ discrete signals of the linear FIR system $2_1$. Since the output signal $y(k)$ is intended to be made equal to the input signal $x(k)$, the following expression (1b) must be satisfied.

$$\delta(k) = h_1(k) \circledast g_{11}(k) \tag{1b}$$

where $$\delta(k) = \begin{cases} 1 \text{ for } k = 1 \\ 0 \text{ for } k = 2, 3, \ldots \end{cases}$$

The intended inverse control can be realized by obtaining coefficients $h_1(k)$ of the filter $21_1$ which satisfy expression (1b). However, in the case where the impulse response $g_{11}(k)$ of the linear FIR system $2_1$ has a non-minimum phase (e.g., such as a system where there are a reflected waves), that is, where the zero of the z-transform, $g_{11}(z)$, of the impulse response $g_{11}(k)$ is also found outside a unit circle on the z-plane, the filter $21_1$ which satisfies $$h_1(z) = \frac{1}{g_{11}(z)}$$

where $h_1(z)$ is the z-transform of the filter coefficients $h_1(k)$, is unstable. Therefore, the inverse control noted above can not be realized. This is disclosed in S. T. Neely and J. B. Allen, "Invertibility of a Room Impulse Response", J. Acoust. Soc. Am., 66(1), pp. 163–169, July, 1979.

In the prior art, therefore, the filter $21_1$ has been realized as a stable and simple FIR filter, which has coefficients $\hat{h}_1(k)$ which minimize the cost function given as $$\sum_{k=1}^{\infty} |e(k)|^2 = \sum_{k=1}^{\infty} |\delta(k) - g_{11}(k) \circledast h_1(k)|^2 \quad (2)$$

Inverse control of a multiple-input multiple-output linear FIR system has been performed in a similar manner.

Such prior art technology, however, has theoretical problems as follows: The filter coefficients $h_1(k)$ obtained in the prior art minimize the square error $$\sum_{k=1}^{\infty} |e(k)|^2$$

but usually do not make it zero. Therefore, it is impossible to realize exact inverse control.

The magnitude of $$\sum_{k=1}^{\infty} |e(k)|^2$$

and characteristics (i.e., frequency versus amplitude characteristic and frequency versus phase characteristic) of $e(k)$ depend on the impulse response $g_{11}(k)$. Therefore, the performance of the inverse control attainable in the prior art varies greatly with the linear FIR system that is controlled.

Further, it is shown in the literature noted above to connect, for an inverse control, a filter to the output side of a microphone, which is adapted to receive sound from an acoustic signal source (i.e. a loudspeaker, a person's mouth etc.) provided in a sound field of a room, for the purpose of removing reverberations or echoes caused by wall reflections. FIG. 3 shows a set-up for inverse control of a single-input single-output linear FIR system similar to the above case. A transmitting element $4_1$ is disposed at an input point $3_1$, and its signal is fed to a linear FIR system $2_1$. The output signal of the linear FIR system $2_1$ is received by a receiving element $6_1$ disposed at an output point $5_1$ of the system $2_1$. The output signal of the receiving element $6_1$ is fed to a filter $21_1$ to obtain a signal with desired characteristics. The output signal $y(k)$ in FIG. 3 is expressed as $$y(k) = g_{11}(k) \circledast h_1(k) \circledast x(k)$$

In this case, if the inverse control is to make the output signal $y(k)$ of the filter $21_1$ equal to the input signal $x(k)$, the following relationship must be satisfied $$\delta(k) = h_1(k) \circledast g_{11}(k) = g_{11}(k) \circledast h_1(k)$$

where $$\delta(k) = \begin{cases} 1 \text{ for } k = 1 \\ 0 \text{ for } k = 2, 3, \ldots \end{cases}$$

These expressions are identical with the equations (1a) and (1b), so that it is necessary to obtain filter coefficients $h_1(k)$ which satisfy these equations. In the prior art, however, the filter coefficients $h_1(k)$ have been obtained in a manner similar to that mentioned previously so that the cost function (2) may become minimum. Further, the same procedure mentioned above has been employed for an inverse control of the output of a multiple-input multiple-output linear FIR system. Therefore, the same problems are posed in the inverse control of the output signal of a linear FIR system as those in the case of the inverse control of the output signal of a linear FIR system.

SUMMARY OF THE INVENTION

An object of the invention is to provide an inverse control system which permits exact inverse control of a multiple-input multiple-output linear FIR system with substantially finite impulse response (which, could not have been theoretically attained in the prior art) to be realized, and also permits an inverse control of stable performance with respect to different linear systems by using stable and simple FIR filters in cascade connection to the linear FIR system.

A first aspect of the invention is applied to an n-input m-output ($n > m$, m being 1 or a greater integer) linear FIR system having m·n FIR signal transmission channels between the n input points and m output points. Signals are fed into the linear system from n transmitting elements disposed at n input points. An inverse control system according to the invention is provided between these transmitting elements and a common signal source to control signals fed to the transmitting elements to provide desired impulse responses between the signal source and m output points. In the inverse control system according to the first aspect of the invention, FIR filters are provided between the signal source and n transmitting elements. When representing the impulse response $g_{ij}(k)$ between the j-th one of the n input points and the i-th one of the m output points of the system with $w_{ij}$ discrete signals and representing the desired impulse response $i_i(k)$ between the signal source and i-th output point with $P_i$ discrete signals, the j-th FIR filter connected to the j-th input point through a transmitting element has a number $L_j$ of taps satisfying the relationships, $$\sum_{s=1}^{n} L_s \geq \sum_{t=1}^{m} (w_{tj} + L_j - 1) \quad (3)$$

$$w_{ij} + L_j - 1 \geq P_i \quad (4)$$

for all $i = 1, 2, \ldots, m$ and $j = 1, 2, \ldots, n$ and the coefficients $h_j(k)$ of the j-th FIR filter satisfies $$r_i(k) = \sum_{j=1}^{n} g_{ij}(k) \circledast h_j(k) \quad (5)$$

for all $i = 1, 2, \ldots, m$, where $\circledast$ represents the discrete convolution.

A second aspect according to the invention is applied to an m-input n-output ($n > m$, m being 1 or a greater integer) linear FIR system having m·n FIR signal transmission channels between the m input points and n output points, where signals provided from the linear system are received by receiving elements disposed at the n output points. An inverse control system according to the invention is provided between the n receiving elements and an adder to control the outputs of the receiving elements to provide desired impulse response between the output of the adder and m input points. In the inverse control system, n FIR filters are provided between the n receiving elements and n input terminals of the adder. When representing the impulse response $g_{ij}(k)$ ($i = 1, 2, \ldots, m$; $j = 1, 2, \ldots, n$) of the system between the i-th one of the m input points and j-th one of the n output points with $w_{ij}$ discrete signals and representing the desired impulse response $r_i(k)$ (i = 1, 2, ..., m) between the i-th input point and the output of the adder with $P_i$ discrete signals, the j-th filter connected to the j-th output point through a transmitting element 5 has a number $L_j$ of taps satisfying the relationships (3) and (4), and the coefficients $h_j(k)$ (j = 1, 2, ..., n) of the j-th FIR filter satisfy the equation (5).

PRINCIPLES UNDERLYING THE INVENTION

The principles underlying the invention will now be described with reference to FIG. 4. In this arrangement according to the invention, a signal transmission channel $7_2$ is defined in addition to the signal transmission channel $7_1$ of the single-input single-output linear FIR system $2_1$ shown in FIG. 2. In other words, the inverse control in this case is utilized for a two-input one-output linear FIR system 14 to obtain desired characteristics of an output signal by giving the desired impulse response to the linear FIR system 14. Transmitting elements $4_1$ and $4_2$ are disposed at input points $3_1$ and $3_2$ of the system 14. A signal from a signal source 13 is coupled through the FIR filters $21_1$ and $21_2$ to the transmitting elements $4_1$ and $4_2$. It is assumed that the filter $21_j$ (j = 1, 2), which is a FIR filter, has $L_j$ taps. Let us now consider an inverse control as described before in connection with the prior art, i.e., an inverse control to make equal the input signal x(k) obtained from the signal source 13 and output signal y(k) of the linear FIR system 14. A desired inverse control can be realized by providing coefficients $h_1(k)$ and $h_2(k)$ of the respective FIR filters $21_1$ and $21_2$ satisfying a condition $$\delta(k) = g_{11}(k) \circledS h_1(k) + g_{12}(k) \circledS h_2(k) \tag{6}$$

where $g_{11}(k)$ and $g_{12}(k)$ are the impulse responses of the signal transmission channel $7_j$ (j = 1 or 2) of the linear FIR system represented by $w_{ij}$ (j = 1, 2) discrete signals.

First, the existence of such filters $21_1$ and $21_2$ will be ascertained. The z-transform of the equation (6) is represented as $$1 = g_{11}(z) \cdot h_1(z) + g_{12}(z) \cdot h_2(z) \tag{7}$$

Denoting the degrees of the polynomials $g_{11}(z)$, $g_{12}(z)$, of z by $dg_1$, $dg_2$, respectively, Euclidean argorithm (G. Birkhoff and S. Maclane, A survey of Modern Algebra, NY: The Macmillan Company, 1965, pp 64–71) yields $$h_1(z) = \hat{h}_1(z) + g_{12}(z)u(z) \tag{8a}$$

$$h_2(z) = \hat{h}_2(z) - g_{11}(z)u(z) \tag{8b}$$

$$\deg \hat{h}_1(z) = dh_1 < \deg g_{12}(z) = dg_2 \tag{8c}$$

$$\deg \hat{h}_2(z) = dh_2 < \deg g_{11}(z) = dg_1 \tag{8d}$$

where $g_{11}(z)$ and $g_{12}(z)$ are relatively prime.

$\hat{h}_1(z)$ and $\hat{h}_2(z)$ are a set of solutions of the equation (7) and u(z) is an arbitrary polynomial of z. The existence of the general solutions $h_1(z)$ and $h_2(z)$ of the equation (7) is thus verified. Let it be assumed that there exist solutions $h'_1(z)$ and $h'_2(z)$ of the equation (7) other than $\hat{h}_1(z)$ and $\hat{h}_2(z)$ that satisfy the following relationships $$\deg h_1'(z) < \deg g_{12}(z) = dg_2 \tag{9a}$$

and $$\deg h_2'(z) < \deg g_{11}(z) = dg_1. \tag{9b}$$

From the equations (8a) and (8b) we have $$h_1'(z) = \hat{h}_1(z) + g_{12}(z) \cdot u(z) \tag{10a}$$

$$h_2'(z) = \hat{h}_2(z) - g_{11}(z) \cdot u(z) \tag{10b}$$

Hence, $$\deg h_1'(z) = \deg g_{12}(z) \cdot u(z) \geq dg_2 \tag{11a}$$

and $$\deg h_2'(z) = \deg g_{11}(z) \cdot u(z) \geq dg_1 \tag{11b}$$

The relationships (11a) and (11b) are contradictory to the assumption of the relationships (9a) and (9b). Since the assumption of the existence of other solutions than the set of solutions $\hat{h}_1(z)$, $\hat{h}_2(z)$ noted above leads to a contradiction, there are only a single set of solutions of the equation (7) that satisfy the relationships (8c) and (8d).

The above verification leads to the following.

(a) FIR filters $21_1$ and $21_2$ having the coefficients $h_1(k)$ and $h_2(k)$ satisfying the equation (6) exist under a condition that the zeros of the transfer functions $g_{11}(z)$ and $g_{12}(z)$ obtained through z-transform of the impulse responses $g_{11}(k)$ and $g_{12}(k)$ do not coincide.

(b) Unique filters can be determined as minimum degree FIR filters $21_1$ and $21_2$ whose orders deg $h_1(z)$ and deg $h_2(z)$ satisfy relationships $$\deg h_1(z) < \deg g_{12}(z) \tag{12a}$$

and $$\deg h_2(z) < \deg g_{11}(z). \tag{12b}$$

Now, a method of setting the coefficients $h_1(k)$ and $h_2(k)$ of the FIR filters $21_1$ and $21_2$ will be described. Representing the impulse responses $g_{11}(k)$ and $g_{12}(k)$ by vectors $G_{11}$ and $G_{12}$ where $G_{1j} = (g_{1j}(1)\ g_{1j}(2)\ \ldots\ g_{1j}(w_{1j}))^T$ (T represents transposition) and j = 1, 2, the filter coefficients $h_1(k)$ and $h_2(k)$ by vectors $H_1$ and $H_2$ where $H_j = (h_j(1)\ h_j(2)\ \ldots\ h_j(L_j))^T$ and j = 1, 2, and the desired impulse response $\delta(k)$ by vector $R_1$ where $R_1 = (\delta(1)\ \delta(2)\ \ldots\ \delta(w_{1j}+L_j-1))^T$, the equation (6) can be expressed as $$R = G \cdot H \tag{13}$$

where
$w_{11} + L_1 - 1 = w_{12} + L_2 - 1$
$H = (H_1^T H_2^T)^T$
$R = (R_1^T)^T$
and $$G = \begin{bmatrix} \begin{matrix} G_{11} & 0 \\ 0 & G_{11} \end{matrix} & \begin{matrix} G_{12} & 0 \\ 0 & G_{12} \end{matrix} \end{bmatrix} =$$

$$\begin{bmatrix} g_{11}^{(1)} & 0 & & & g_{12}^{(1)} & 0 & & \\ g_{11}^{(2)} & g_{11}^{(1)} & & & g_{12}^{(2)} & g_{12}^{(1)} & & \\ \vdots & g_{11}^{(2)} & \searrow & & \vdots & g_{12}^{(2)} & \searrow & \\ g_{11}(w_{11}) & \vdots & & g_{11}^{(1)} & g_{12}(w_{12}) & \vdots & & g_{12}^{(1)} \\ & g_{11}(w_{11}) & & g_{11}^{(2)} & & g_{12}(w_{12}) & & g_{12}^{(2)} \\ 0 & & \searrow & \vdots & 0 & & \searrow & \vdots \\ & & & g_{11}(w_{11}) & & & & g_{12}(w_{12}) \end{bmatrix}$$

Under the principles of linear discrete convolution, the convolution matrix G on the right side of the equation (13) is a $(w_{1j}+L_j-1)\times(L_1+L_2)$ matrix where $j=1, 2$. The equation (13) can be solved as follows.

(1) With the tap numbers $L_1$ and $L_2$ of the FIR filters $21_1$ and $21_2$ set to satisfy the following relationships $$L_1 = w_{12} - 1 \tag{14a}$$

and $$L_2 = w_{11} - 1 \tag{14b}$$

the convolution matrix G becomes a square matrix. Since the existence of the solutions $h_1(k)$ and $h_2(k)$ is verified, there exists an inverse matrix $G^{-1}$. The equation (13) thus can be solved as $$H = G^{-1} \cdot R \tag{15}$$

The filter coefficients $h_1(k)$ and $h_2(k)$ thus can be determined uniquely.

(2) With the tap numbers $L_1$ and $L_2$ of the FIR filters $21_1$ and $21_2$ set to satisfy the relationships $$L_1 > w_{12} - 1 \tag{16a}$$

and $$L_2 > w_{11} - 1 \tag{16b}$$

the equation (13) becomes an indeterminate equation. In this case, the solutions $h_1(k)$ and $h_2(k)$ exist infinitely. However, by providing a restriction to minimize the norm of the filter coefficient vector H given as $$|H| = \sqrt{|H_1|^2 + |H_2|^2} = \sqrt{h_1(1)^2 + \ldots + h_1(L_1)^2 + h_2(1)^2 + \ldots + h_2(L_2)^2} \tag{17}$$

the filter coefficients $h_1(k)$ and $h_2(k)$ can be determined as follows.

$$H = G^T \cdot (G \cdot G^T)^{-1} \cdot R \tag{18}$$

where T represents transposition. The solution shown by the equation (18) is also applicable when the FIR filter tap numbers are set as shown in the equations (14a) and (14b). In this case, the same solutions $h_1(k)$ and $h_2(k)$ as those of the equation (15) can be obtained.

(3) With the tap numbers $L_1$ and $L_2$ of the FIR filters $21_1$ and $21_2$ set to satisfy conditions $$L_1 \geq w_{12} - 1 \tag{19a}$$

and $$L_2 \geq w_{11} - 1 \tag{19b}$$

the filter coefficients $h_1(k)$ and $h_2(k)$ can be determined through recursive computation expressed as $$H(q+1) = H(q) + \alpha(q) \cdot G^T \cdot [R - G \cdot H(q)] \tag{20}$$

where q is the number of times the argorithm of the equation (20) is repeatedly performed, and $\alpha(q)$ is the step size i.e. the amount by which to move from H(q). If the equality holds with the expressions (19a) and (19b), the same solutions as $h_1(k)$ and $h_2(k)$ can be obtained as the filter coefficients from the conditions (14a) and (14b).

The foregoing description has been concerned with $\delta(k)$ as the desired impulse response. However, it is also possible to use an arbitrary impulse response $r_1(k)$ which can be represented by $P_1$ discrete signals. When using $r_1(k)$, the relations (14a), (14b), (16a), (16b), (19a) and (19b), and vector $R_1$ may be set as follows.

$$\left.\begin{array}{l} L_1 + L_2 = (w_{11} + L_1 - 1) + (w_{12} + L_2 - 1) \\ w_{11} + L_1 - 1 \geq P_1 \end{array}\right\} \tag{14)'}$$

$$\left.\begin{array}{l} L_1 + L_2 > (w_{11} + L_1 - 1) + (w_{12} + L_2 - 1) \\ w_{11} + L_1 - 1 \geq P_1 \end{array}\right\} \tag{16)'}$$

$$\left.\begin{array}{l} L_1 + L_2 \geq (w_{11} + L_1 - 1) + (w_{12} + L_2 - 1) \\ w_{11} + L_1 - 1 \geq P_1 \end{array}\right\} \tag{19)'}$$

$$R_1 = (r_1(1) r_2(2) \ldots r_1(P_1) \underbrace{0 \ldots 0}_{Q})$$

$$Q = w_{11} + L_1 - 1 - P_1 = w_{12} + L_2 - 1 - P_1$$

Incidentally, in the foregoing explanation, the linear FIR system has been assumed to have no delay notwithstanding that a practical linear FIR system always has a delay. Supposing that the impulse responses $g_{11}(k)$ and $g_{12}(k)$ have delays $D_{11}$ and $D_{12}$, respectively, as expressed by $$g_{11}(k) = 0 \text{ for } k=1, 2, \ldots, D_{11}$$

and $$g_{12}(k) = 0 \text{ for } k=1, 2, \ldots, D_{12}$$

then, the previous expressions (15), (18), (20) can be made effective simply by deleting a delay component of $D_{12}$ (assuming that $D_{11} \geq D_{12}$) common to both $g_{11}(k)$ and $g_{12}(k)$ as shown by $$g_{11}(k) = 0 \text{ for } k=1, 2, \ldots D_{11} - D_{12}$$

and $$g_{12}(k) \iota 0 \text{ and } k = 1.$$

As will be understood from the above, the presence of delay in the practical linear FIR system does not refute the principles of the invention and, therefore, the nodelayassumption will be maintained in the following explanation, for simplicity.

When the invention is applied to an inverse control of the output of a linear FIR system as shown in FIG. 3, an arrangement as shown in FIG. 5 may be used. In this instance, a signal transmission channel $7_2$ between an input point $3_1$ and an output point $5_2$ is additionally provided in parallel with a signal transmission channel $7_1$ between input point $3_1$ and an output point $5_1$. A receiving element $6_2$ is disposed at the output point $5_2$, and its output is fed to a FIR filter $21_2$. The outputs of the FIR filters $21_1$ and $21_2$ are added together in an adder 16. The outputs of the linear FIR system 15 from the output points $5_1$ and $5_2$, are subjected to inverse control such that the output y(k) of the adder 16 may have desired characteristics, e.g., the output y(k) may be identical to the input x(k) to the linear FIR system 15. It will be readily understood that in this case filter coefficients $h_1(k)$ and $h_2(k)$ satisfying the equation (6) may be obtained and set for the FIR filters $21_1$ and $21_2$.

The principles underlying the invention as described above, can be generally applied to an inverse control with respect to an n-input ($3_1$ to $3_n$) m-output ($5_1$ to $5_m$) linear FIR system 17 as shown in FIG. 6 (where $n \geq m+1$, $m=1, 2, \ldots$), which is obtained by connecting an extra one or more signal transmission channels in parallel with a linear FIR system having one or more signal transmission channels, with n FIR filters $21_1$ to $21_n$ connected between the signal source 13 and the respective n input points $3_1$ to $3_n$. The principles also can be applied to a similar inverse control with respect to n outputs of an m-input ($3_1$ to $3_m$) n-output ($5_1$ to $5_n$) linear FIR system 18 as shown in FIG. 7 ($n \geq m+1$, $m=1, 2, \ldots$), where n inverse-controlled outputs from n FIR filters $21_1$ to $21_n$, are added by the adder 16.

More specifically, denoting the impulse response $g_{ij}(k)$ ($i=1, 2, \ldots, m$, $j=1, 2, \ldots, n$) of the linear FIR system 17 or 18 by vector $G_{ij}$ where $G_{ij}=(g_{ij}(1)\ g_{ij}(2) \ldots g_{ij}(w_{ij}))^T$, the coefficients $h_1(k), h_2(k), \ldots, h_n(k)$ of the n FIR filters $21_1$ to $21_n$ each having $L_j$ ($j=1, 2, \ldots, n$) taps by vector $H_1$ to $H_n$ where $H_j=(h_j(1)\ h_j(2) \ldots h_j(L_j))^T$, and the desired transmission characteristics $r_1(k), r_2(k), \ldots, r_m(k)$ given by $p_i$ discrete signals by vectors $R_1$ to $R_m$ where $R_i=(r_i(1)\ r_i(2) \ldots r_i(p_i)\ 0 \ldots 0)^T$ and $Q_i = w_{ij} + L_j - 1 - P_i$, then the following $Q_i$ can be obtained.

(1) With the tap numbers of the FIR filters $21_1$ to $21_n$ set to satisfy the conditions (3) and (4), the filter coefficients $h_1(k)$ to $h_n(k)$ can be determined using a method of solution given as $$H = G^T \cdot (G \cdot G^T)^{-1} \cdot R$$

or $$H(q+1) = H(q) + \alpha(q) \cdot G^T\ 19\ (R - G \cdot H(q))$$

where $$H = (H_1^T H_2^T \ldots H_n^T)^T,\ H_j = (h_j(1) h_j(2) \ldots h_j(L_j))^T,$$

$$R = (R_1^T R_2^T \ldots R_m^T)^T,\ R_i = (r_i(1) r_i(2) \ldots r_i(P_i) 0 \ldots 0)^T$$
$$\quad\quad\quad\quad\quad\quad\quad\quad\quad\quad\quad\quad\quad \leftarrow Q \rightarrow$$

$$Q = w_{ij} + L_j - 1 - P_i,$$

$$G = \begin{bmatrix}
g_{11}(1) & & 0 & & g_{1n}(1) & & 0 \\
g_{11}(2) & g_{11}(1) & & & g_{1n}(2) & g_{1n}(1) & \\
\vdots & & & & \vdots & g_{1n}(2) & \\
& g_{11}(2) & & g_{11}(1) & \vdots & & \\
& \vdots & & g_{11}(2) & & & g_{1n}(1) \\
g_{11}(w_{11}) & \vdots & & & g_{1n}(w_{1n}) & \vdots & g_{1n}(2) \\
& & & & & g_{1n}(w_{1n}) & \vdots \\
& g_{11}(w_{11}) & & \vdots & & & \\
0 & & & \vdots & & & g_{1n}(w_{1n}) \\
& & g_{11}(w_{11}) & 0 & & & \\
\vdots & & \vdots & & \vdots & & \\
& & & & & & \\
g_{m1}(1) & & 0 & & g_{mn}(1) & & \\
g_{m1}(2) & g_{m1}(1) & & & g_{mn}(2) & g_{mn}(1) & \\
\vdots & & & & \vdots & g_{mn}(2) & \\
& g_{m1}(2) & & g_{m1}(1) & & & g_{mn}(1) \\
\vdots & \vdots & & g_{m1}(2) & \vdots & \vdots & g_{mn}(2) \\
g_{m1}(w_{m1}) & \vdots & & \vdots & g_{mn}(w_{mn}) & \vdots & \vdots \\
& & & g_{m1}(1) & & g_{mn}(w_{mn}) & \vdots \\
& g_{m1}(w_{m1}) & & g_{m1}(2) & & & \\
0 & & & \vdots & 0 & & g_{mn}(w_{mn}) \\
& & g_{m1}(w_{m1}) & & & & \\
\end{bmatrix}$$

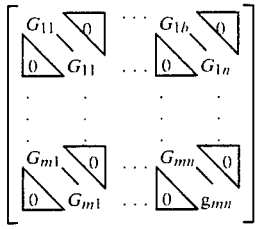

$$G_{ij} = (g_{ij}(1) g_{ij}(2) \ldots g_{ij}(w_{ij}))^T$$

(2) When the equality of the condition (3) holds, the filter coefficients $h_1(k)$ to $h_n(k)$ can be realized with the least tap numbers by solving an equation $$H = G^{-1} \cdot R \qquad (23)$$

Further in case of $$n = m + 1$$

it is possible to realize an inverse control of the linear FIR system with the least number of FIR filters $21_1$ to $21_n$, i.e., with the least number of transmitting elements $4_1$ to $4_n$ in the arrangement of FIG. 6 and with the least number of receiving elements $6_1$ to $6_n$ in the arrangement of FIG. 7.

DETAILED DESCRIPTION OF THE PREFERRED EMBODIMENTS

Embodiment 1

Figure 1:
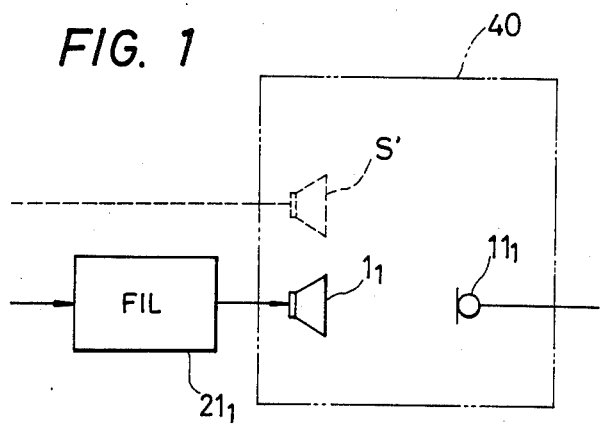
FIG. 1 is a view showing a relation between a loudspeaker and a controlled element for explaining prior art sound pressure control.
Figure 2:
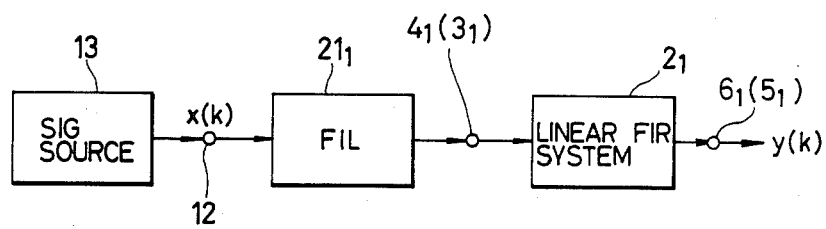
FIG. 2 is a block diagram showing a prior art inverse control system for controlling an input signal.
Figure 3:
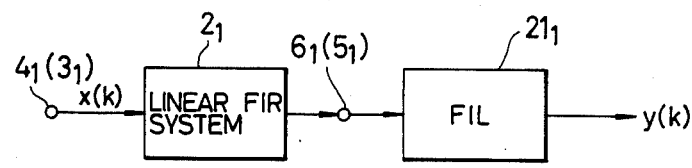
FIG. 3 is a block diagram showing a prior art inverse control system for controlling an output signal.
Figure 4:
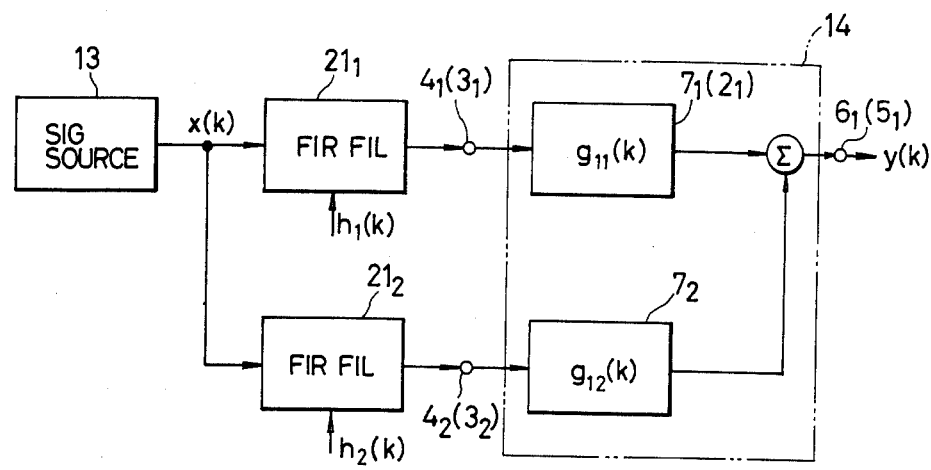
FIG. 4 is a block diagram showing an embodiment of the invention applied to an inverse control system for the input signal to a 2-input 1-output linear FIR system.
Figure 5:
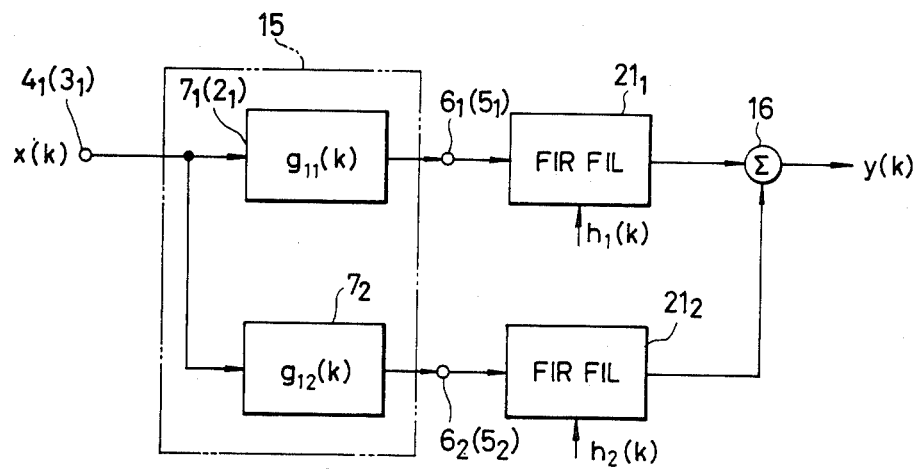
FIG. 5 is a block diagram showing an embodiment of the invention applied to an output signal of a 1-input 2-output linear FIR system.
Figure 6:
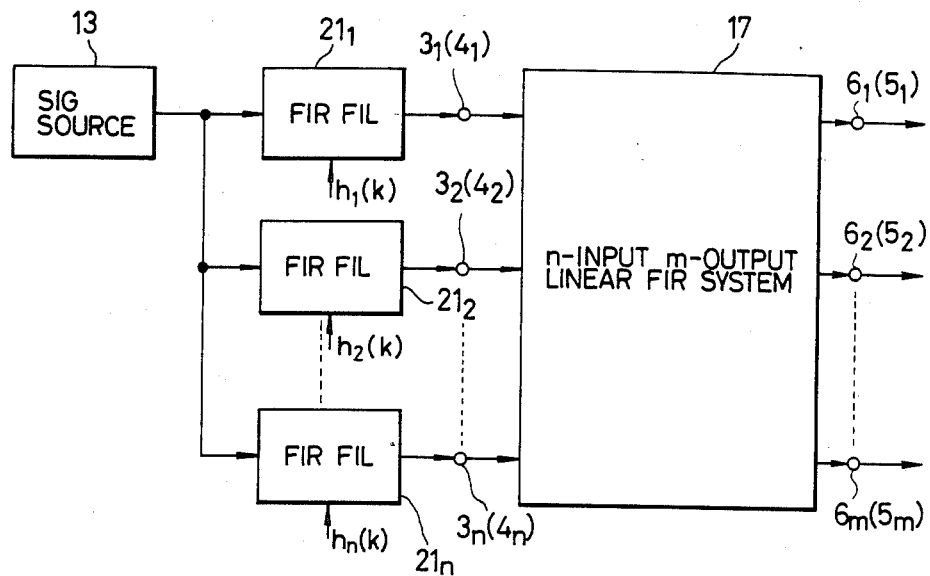
FIG. 6 is a block diagram showing a general construction according to the invention for the inverse control of the inputs to an n-input m-output linear FIR system.
Figure 7:
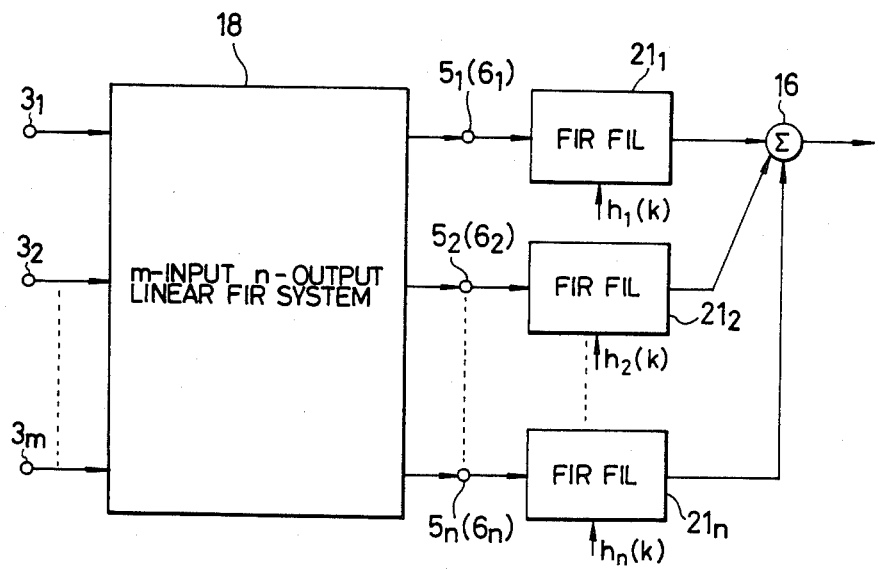
FIG. 7 is a block diagram showing a general construction according to the invention for the inverse control of the outputs of an m-input n-output linear FIR system.
Figure 8:
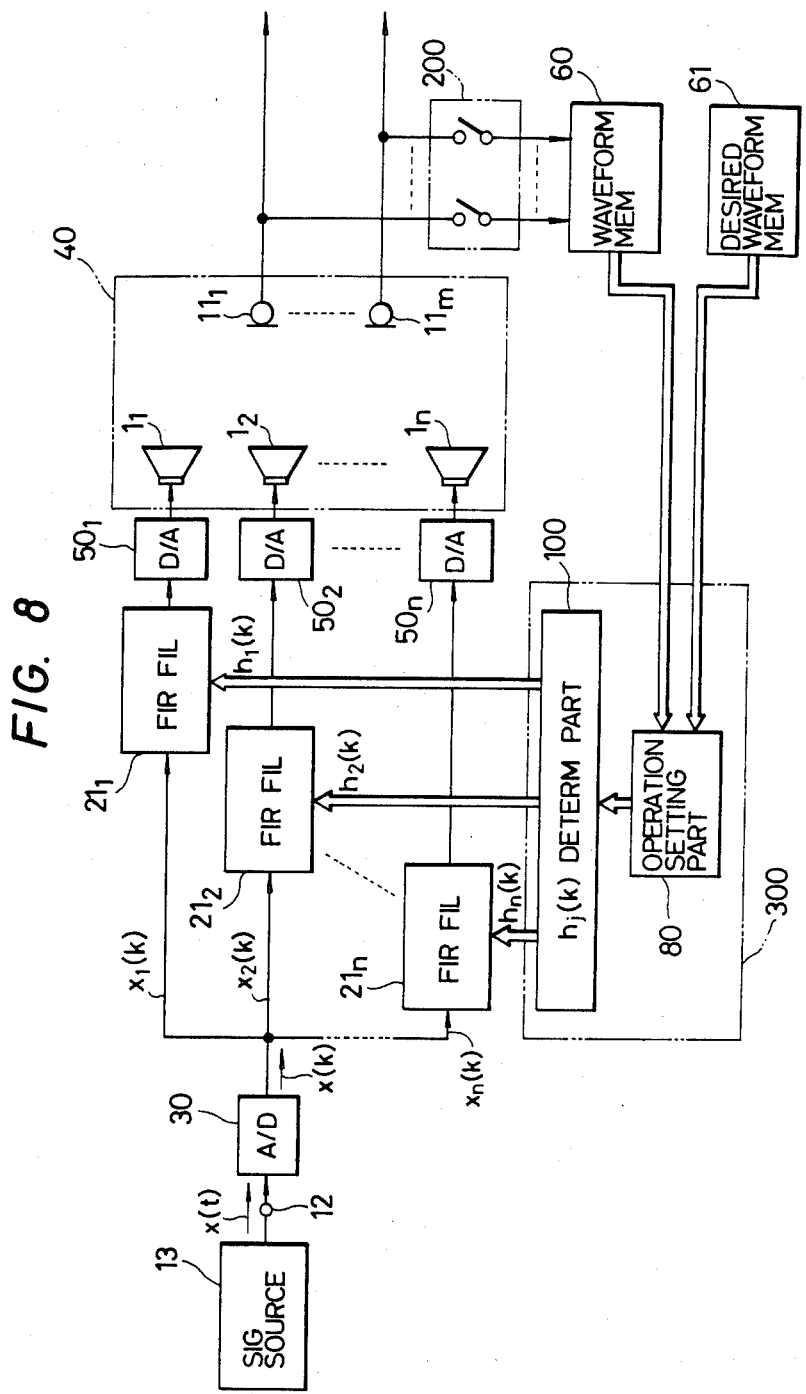
FIG. 8 is a block diagram showing an embodiment of the invention applied to an n-input m-output acoustic system.

FIG. 8 shows one embodiment of the invention. In this instance, the whole system consists of a digital signal system. Referring to the Figure, an input signal $x(t)$ from a signal source 13 is fed to an A/D converter 30. The A/D converter 30 provides the input signal $x(t)$ as discrete signal $x(k)$ (k is an integer index). The discrete signal $x(k)$ is fed as the same n ($n = 2, 3, \ldots$) signals $x_j(k)$ ($j = 1, 2, \ldots, n$) to respective n FIR filters $21_1$ to $21_n$. The outputs of these FIR filters $21_1$ to $21_n$ are fed through respective D/A converters $50_1$ to $50_n$ to respective loudspeakers $1_1$ to $1_n$ acting as transmitting elements.

In this embodiment, m ($m \leq n - 1$) microphones $11_1$ to $11_m$ are disposed at respective controlled points, i.e., the output points of the n-input m-output linear FIR system. When an impulse is fed to the A/D converter 30, the outputs of the microphones $11_1$ to $11_m$ are fed to a waveform memory 60 through a switch 200. In the waveform memory 60 are thus stored $m \times n$ impulse response vectors $G_{ij} = (g_{ij}(1) \ g_{ij}(2) \ldots g_{ij}(w_{ij}))^T$ between the n loudspeakers $1_1$ to $1_n$ and m microphones $11_1$ to $11_m$, where $g_{ij}(k)$ is an impulse response, k is an integer, $i=1, 2, \ldots, m$, and $j=1, 2, \ldots, n$.

The output of the waveform memory 60 is also fed to an operation setting part 80 of a coefficient setting part 300. To the operation setting part 80 is also fed the output of a desired waveform memory 61, in which m desired impulse response vectors $R_i=(r_i(1) \; r_i(2) \ldots r_i(P_i))^T$ determined for the individual microphones $11_1$ to $11_m$ have been prestored, where $r_i(k)$ represents a desired impulse response. The output of the operation setting part 80 is fed to a filter coefficient determining part 100, the output of which is fed to the preset input sides of the n FIR filters $21_1$ to $21_n$.

The operation of the embodiment will now be described. In this embodiment, it is assumed that the n FIR filters $21_1$ to $21_n$ are set such that they initially provide the input signal $x_j(k)$ ($j=1, 2, \ldots, n$) without processing. The impulse response vectors $G_{ij}$ ($i=1, 2, \ldots, m, j=1, 2, \ldots, n$) between the loudspeaker $1_1$ to $1_n$ and microphones $11_1$ to $11_m$ are prestored in the waveform memory 60 through the switch 200. In the desired waveform memory 61 are preliminarily stored the m desired impulse response vectors $R_i$ for the respective microphones $11_1$ to $11_m$.

The operation setting part 80 performs the following processings using the impulse response vectors $G_{ij}$ and desired impulse response vectors $R_i$ supplied from the waveform memory 60 and desired waveform memory 61.

(1) A filter tap number $L_j$ is determined, which satisfies the following relationships $$\sum_{s=1}^{n} L_s \geq \sum_{t=1}^{m} (w_{tj} + L_j - 1) \tag{24}$$

and $$P_i \leq w_{ij} + L_j - 1 \tag{25}$$

for all $i=1, 2, \ldots, m$ and $j=1, 2, \ldots, n$.

(2) When the relationships $$P_i < w_{ij} + L_j - 1$$

for all $i=1, 2, \ldots, m$ and $j=1, 2, \ldots, n$ are set in the processing (1), the desired impulse response vectors $R_i$ are replaced such that $$R_i' = (R_i^T \underbrace{0 \ldots 0}_{Q_i})^T, \tag{26}$$

$$Q_i = w_{ij} + L_j - 1 - P_i$$

to set a new relation $$R_i = R_i' \tag{26'}$$

(3) Using the desired impulse response vectors $R_i$, a desired vector R given as $$R = (R_1^T R_2^T \ldots R_m^T)^T$$

having a length given as $$\sum_{t=1}^{m} (w_{tj} + L_j - 1)$$

is produced.

(4) Using the impulse vectors $G_{ij}$ a convolution matrix G given as $$G = \begin{bmatrix} G_{11} & 0 & & G_{1n} & 0 \\ 0 & G_{11} & \cdots & 0 & G_{1n} \\ & & & & \\ G_{m1} & 0 & & G_{mn} & 0 \\ 0 & G_{m1} & \cdots & 0 & G_{mn} \end{bmatrix} \updownarrow \sum_{t=1}^{m} (w_{tj} + L_j - 1)$$

$$\longleftarrow \sum_{s=1}^{n} L_s \longrightarrow$$

where $G_{ij}=(g_{ij}(1) g_{ij}(2) \ldots g_{ij}(w_{ij}))^T$ is produced.

(5) Regarding the number of rows $$\sum_{t=1}^{m} (w_{tj} + L_j - 1)$$

and number of columns $$\sum_{s=1}^{n} L_s$$

of the convolution matrix G obtained in the above processing (4):

(a) the unit matrix E of $$\sum_{s=1}^{n} L_s \times \sum_{s=1}^{n} L_s$$

is produced when $$\sum_{s=1}^{n} L_s = \sum_{t=1}^{m} (w_{tj} + L_j - 1)$$

and (b) the transposed matrix $G^T$ of the convolution matrix G is produced when $$\sum_{s=1}^{n} L_s > \sum_{t=1}^{m} (w_{tj} + L_j - 1).$$

After the above processings (1) through (5), the operation setting part 80 provides R, G and $G^T$ (or E) to the filter coefficient determining part 100.

Figure 9:
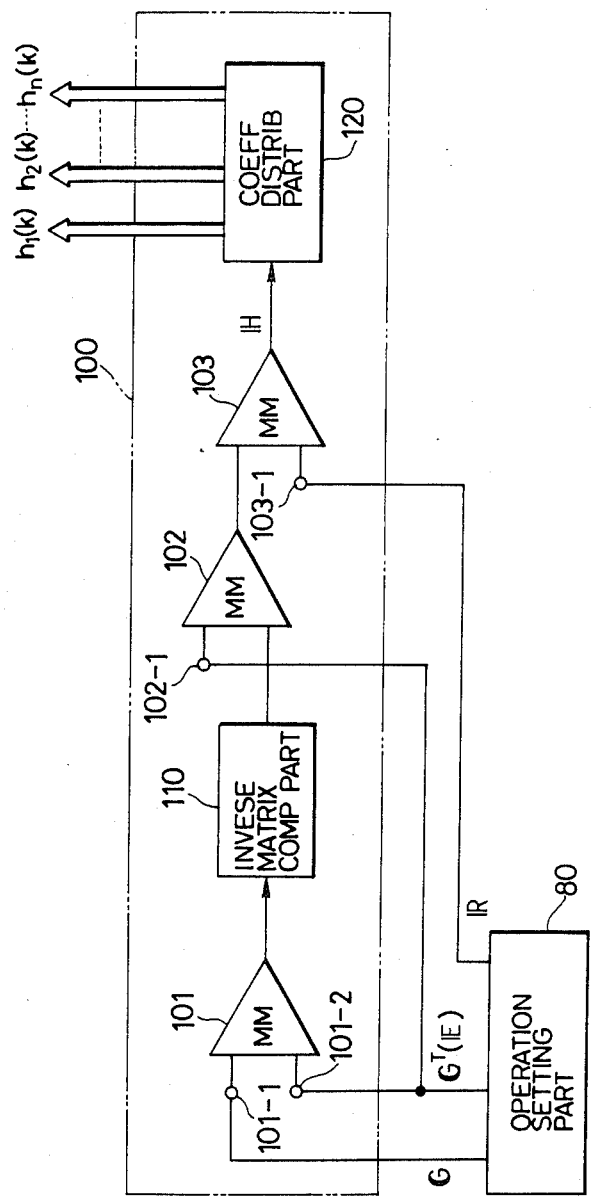
FIG. 9 is a block diagram showing an example of filter coefficient determining part 100 shown in FIG. 8.

The filter coefficient determining part 100 has a structure as shown in FIG. 9. As is shown, it includes three matrix multipliers 101 to 103, an inverse matrix computing part 110 and a coefficient distributing part 120. The operation of the filter coefficient determining part 100 will now be described with reference to FIG. 9.

(6) G and $G^T$ (or E) are fed to respective input terminals 101-1 and 101-2 of the matrix multiplier 101, and their product $G \cdot G^T$ (or G) is computed and output.

(7) From the output of the matrix multiplier 101 the inverse matrix computing part 110 obtains $(G \cdot G^T)^{-1}$ (or $G^{-1}$), which is fed to the matrix multiplier 102.

(8) The matrix multiplier 102 receives $G^T$ (or E) from the input terminal 102-1 and feeds $G^T(G \cdot G^T)^{-1}$ (or $G^{-1}$) as output to the matrix multiplier 103.

(9) The matrix multiplier 103 receives R from the input terminal 103-1 and, as a result, obtains the following filter coefficients vector H.

$$H = G^T \cdot (G \cdot G^T)^{-1} \cdot R \text{ for } \sum_{s=1}^{n} L_s > \sum_{t=1}^{m} (w_{tj} + L_j - 1), \text{ and} \quad (27)$$

$$H = G^{-1} \cdot R \text{ for } \sum_{s=1}^{n} L_s = \sum_{t=1}^{m} (w_{tj} + L_j - 1), \text{ where} \quad (28)$$

$$H = (H_1^T H_2^T \ldots H_n^T)^T$$

$$H_j = (h_j(1) \cdot h_j(2) \ldots h_j(L_j))^T$$

$$j = 1, 2, \ldots, n$$

(10) The coefficients distributing part 120 distributes and sets filter coefficients $h_1(k)$ to $h_n(k)$ (k is an integer index) for the n FIR filters $21_1$ to $21_n$ as obtained using the relations (27) and (28).

After the coefficients of the FIR filters $21_1$ to $21_n$ have been set through the above processings (1) through (10), the input signal x(t) is supplied from the signal source 13 of the system. When this is done, the acoustic signals radiated from the loudspeakers $1_1$ to $1_n$ perfectly reproduce at the m microphones $11_1$ to $11_m$ the desired impulse responses determined for these points. Desired sound pressures can be given to a person's ears at each of the points of installation of the microphones $11_1$ to $11_m$.

Figure 10:
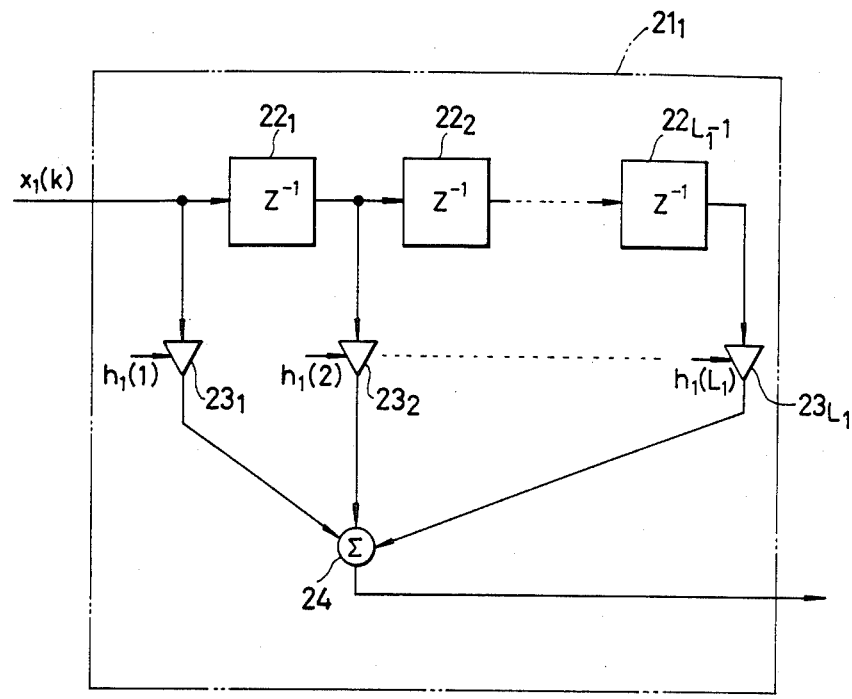
FIG. 10 is a block diagram showing an example of FIR filter $21_1$.

FIG. 10 typically shows the FIR filter $21_1$ among the FIR filters $21_1$ to $21_n$. The discrete signal $x_1(k)$ from the A/D converter 30 is fed to a series combination of delay elements $22_1$ to $22_{L1-1}$. The delay elements $22_1$ to $22_{L1-1}$ each provide the same unit delay time $Z^{-1}$ as the signal interval of the discrete input signal $x_1(k)$. The input signal $x_1(k)$ and output signals of the delay elements $22_1$ to $22_{L1-1}$ are fed to respective multipliers $23_1$ to $23_{L1}$ and multiplied by the filter coefficients $h_1(1)$, $h_1(2)$, ... $h_1(L_1)$ respectively. The outputs of the multipliers $23_1$ to $23_{L1}$ are added together in an adder 24, which provides the filter output.

The filter coefficients can be computed by various successive approximation processes in addition to the above processings (1) to (10). A successive approximation process requires attention to the convergency of the argorithm or the like. However, it is advantageous in view of the amount of computations and amount of memory compared to the above process of directly obtaining the inverse matrix $G^{-1}$ or minimum norm g-inverse $G^T(G \cdot G^T)^{-1}$.

Figure 11:
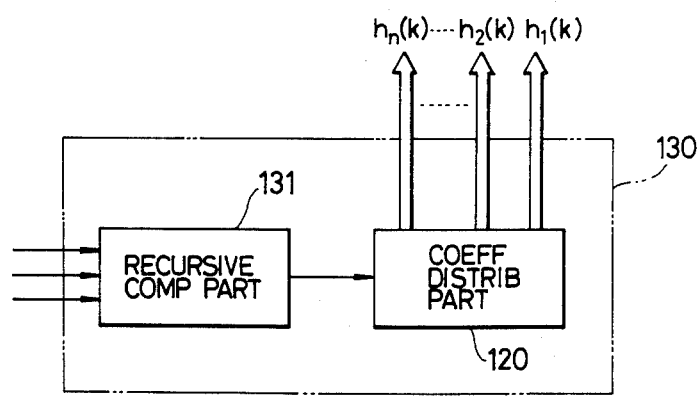
FIG. 11 is a block diagram showing an example of computing filter coefficients through a recursive approximation process.

When a successive approximation process is employed, the filter coefficient determining part 100 shown in FIG. 8 may be replaced with a recursive filter coefficient determining part 130 as shown in FIG. 11. The successive filter coefficient determining part 130 includes a recursive computation part 131 and a coefficients distributing part 120. The recursive computation part 131 can obtain filter coefficients through the method of steepest descent argorithm given as $$H(q+1) = H(q) + \alpha(q) \cdot R - G^T \cdot (G \cdot H(q)) \quad (29)$$

where q is a parameter representing the number of times the argorithm is used repeatedly, and $\alpha(q)$ is the step size, i.e., the amount by which to move from H(q).

EMBODIMENT 2

In the preceding Embodiment 1, a desired sound pressure distribution can be realized through control of the acoustic signals radiated from n ($n \geq 2$) loudspeakers (i.e., n input points) at m ($m \leq n-1$) output points $5_1$ to $5_m$ such as to satisfy the desired impulse responses preset for the respective output points.

In the case of a control such as to "make the sound pressures at the m output points all zero", however, the tap coefficients of the n FIR filters $21_1$ to $21_n$ would be all made zero as seen from the fact that R in the equations (27) and (28) becomes a zero vector. Such a control is meaningless in practice.

However, a control which holds the sound pressures at the m output points $5_1$ to $5_m$ all zero while there are acoustic signals at points other than the output points, is very often required as a means for preventing the howling phenomenon which may be caused by an acoustical coupling between a loudspeaker and a microphone in an audio system for teleconferences or the like.

Figure 12:
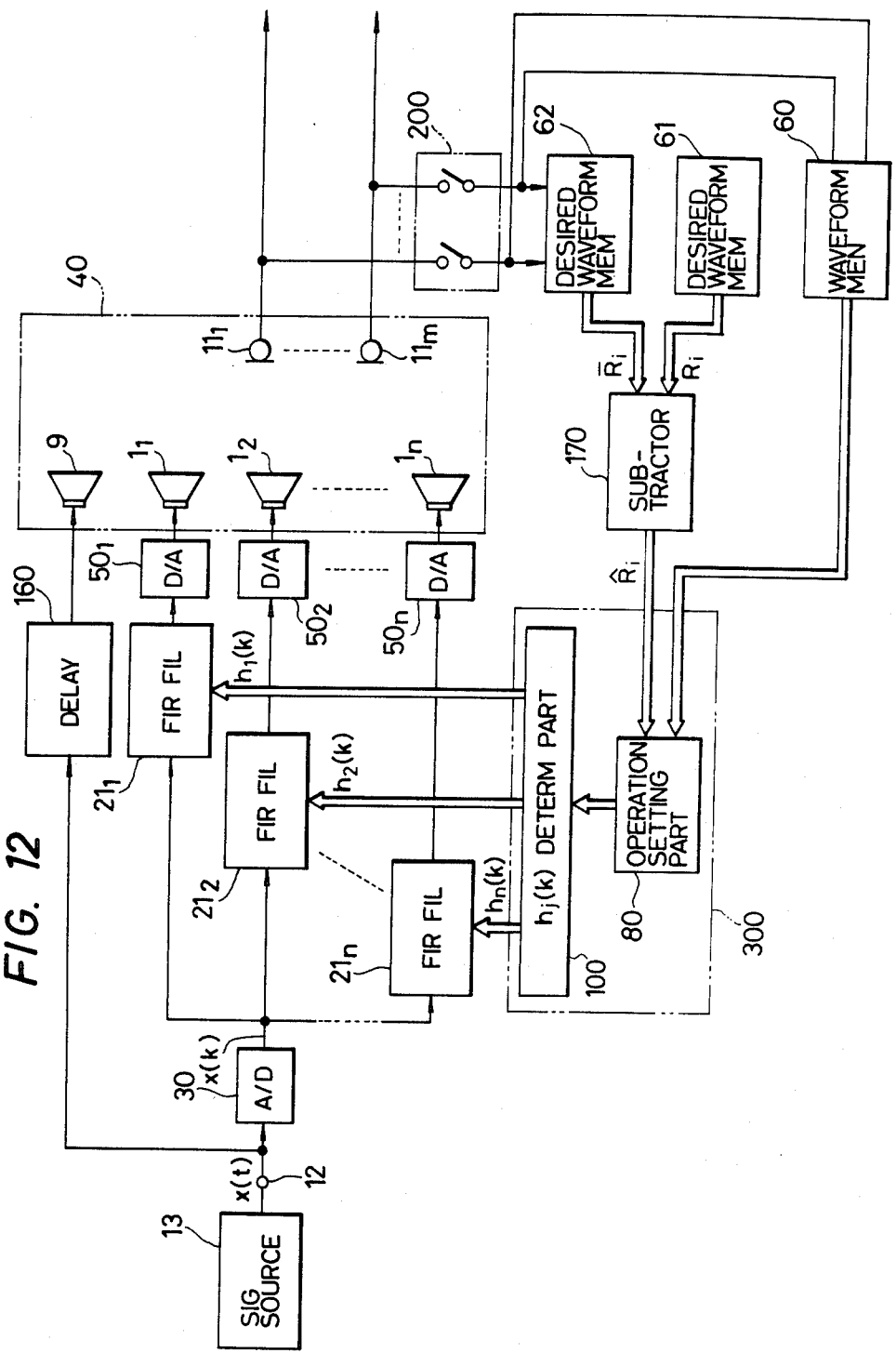
FIG. 12 is a block diagram showing an embodiment of the invention applied to a case where sound pressures at output points are all made zero while providing acoustic signals of sufficient volumes at points other than the output points.

FIG. 12 shows an embodiment of the invention, which is a slight modification of the system of the Embodiment 1 to permit the control as noted above. Parts in FIG. 12 like those in FIG. 8 are designated by like reference numerals, and their duplicated description is omitted. Referring to FIG. 12, an input signal x(t) from a signal source 13 is also fed to an additional loudspeaker 9 through a delay circuit 160.

The delay circuit 160 is intended to provide an adequate delay time such that the acoustic signal radiating from the loudspeaker 9 reaches m microphones $11_1$ to $11_m$, later than the time any of the acoustic signals from n loudspeaker $1_1$ to $1_n$ reaches the microphones $11_1$ to $11_m$. This means that the delay circuit 160 may be omitted if the loudspeaker 9 is disposed such that it is more distant from the m microphones $11_1$ to $11_m$ than the loudspeakers $1_1$ to $1_n$. The delay circuit 160 is used to avoid such a contradictory situation as "controlling a signal leading in time with a signal lagging behind".

Further, an additional desired waveform memory 62 is connected along with the desired waveform memory 61 to a substractor 170, the output of which is fed to an operation setting part 80 in a coefficients setting part 300.

The operation of this embodiment will now be described. It is assumed that in this embodiment m impulse response vectors $\bar{R}_i$ (i=1, 2, ..., m) between the loudspeaker 9 and microphones $11_1$ to $11_m$ are initially stored in the desired waveform memory 62. For the rest, the same initial data are stored as in the Embodiment 1.

The subtractor 170 performs an operation $$\hat{R}_i = R_i - \bar{R}_i \text{ for all } i=1, 2, \ldots, m \quad (30)$$

using the impulse response vectors $R_i$ and $\bar{R}_i$ stored in the desired waveform memories 61 and 62, and $\hat{R}_i$, i.e., desired impulse response vectors, are fed to operation setting part 80. If all the vectors $R_i$ in the equation (30) are zero vectors, the desired impulse response vectors are $$\hat{R}_i = -\bar{R}_i \text{ for all } i=1, 2, \ldots, m \quad (31)$$

This means that the desired impulse response vector $\hat{R}_i$ is 180°-out of phase relative to the phase of the m impulse response vectors $\bar{R}_i$ (i=1, 2, ..., m) from the loudspeaker 9 to the microphones $11_1$ to $11_m$. In other words, what is inverse in phase to the impulse response vectors $\bar{R}_i$ is obtained through this processing.

Subsequently, the coefficients of the n FIR filters $21_1$ to $21_n$ may be determined through the same processings (1) to (10) as described before in connection with the Embodiment 1.

When the input signal is fed from the signal source 13 to the loudspeakers $1_1$ to $1_n$ after completion of the setting of the filter coefficients for the FIR filters $21_1$ to $21_n$, the acoustic signals at the m microphones $11_1$ to $11_m$ can satisfy the impulse responses given by the equation (31). The resultant situation is as though the loudspeakers $1_1$ to $1_n$ were producing sounds in the inverse phase to the sound from the loudspeaker 9. Therefore, if the same input signal is fed to the loudspeaker 9 and also to the loudspeakers $1_1$ to $1_n$, the sound pressures at the m microphones $11_1$ to $11_m$ are all made zero while there are acoustic signals at points other than the microphones $11_1$ to $11_m$.

That is, a control to make the sound pressures at the positions of the m microphones $11_1$ to $11_m$ in the sound field all zero while providing acoustic signals of sufficient volumes at other points, can be realized by additionally providing one or more loudspeakers to the system of the previous Embodiment 1. This means that the system according to the invention can also be utilized as a means for preventing howling phenomenon. That is, a person can hear sounds from the loudspeakers $1_1$ to $1_n$ at a point near any one of the microphones $11_1$ to $11_m$, while the sounds from the loudspeakers are not received by that microphone although the voice from that person is fed to the microphone.

EMBODIMENT 3

It has been described in connection with the preceding Embodiment 2 that the system according to the invention can be utilized for preventing howling phenomenon by additionally providing one or more loudspeakers which can radiate acoustic signals.

Figure 13:
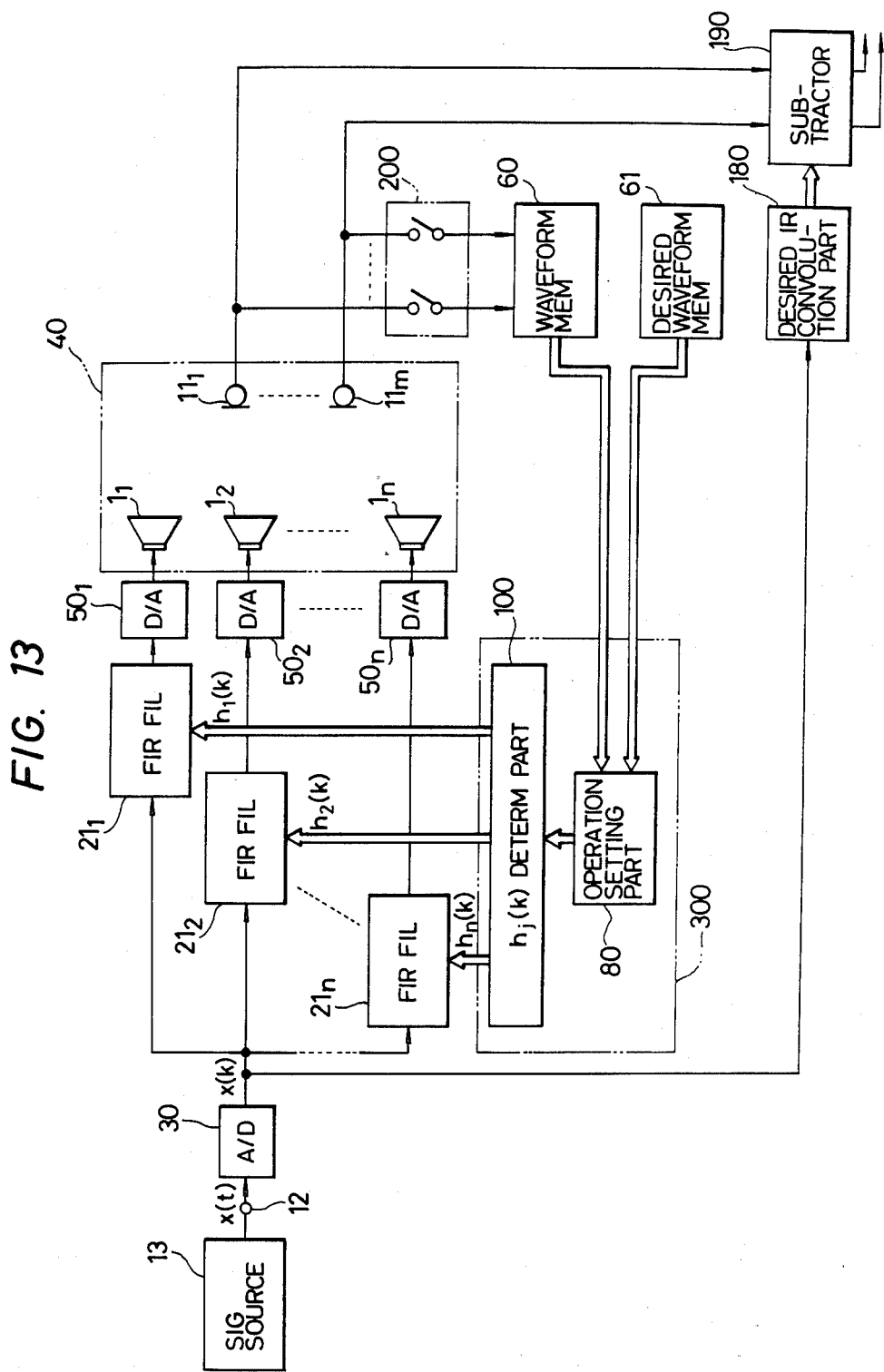
FIG. 13 is a block diagram showing an embodiment of the invention applied to a case where the output signals of receiving elements disposed at the output points are all made zero while providing a desired sound pressure distribution with respect to the positions of the output points.

In the Embodiment 3 of the invention, howling phenomenon is suppressed by making zero each of the output signals of microphones disposed at m output points. FIG. 13 shows this embodiment. Parts like those in FIG. 8 are designated by like reference numerals.

In this embodiment, a desired impulse response convolution part 180 is newly provided. The part 180 realizes desired impulse response vectors provided at m output points, i.e., microphones, using FIR filters or the like. It effects real-time convolution between desired impulse responses and discrete input signal x(k). Further, the input signal x(k) is fed to the input side of the desired impulse response convolution part 180. The output of the part 180 is fed along with the outputs of microphones $11_1$ to $11_m$ to a subtractor 190.

The operation of this embodiment will now be described. It is assumed that the filter coefficients for n FIR filters $21_1$ to $21_n$ have been set through the processings (1) through (10) described before in connection with the Embodiment 1. If the same input signal is fed to the desired impulse response convolution part 180 and also to the loudspeakers $1_1$ to $1_n$, the desired impulse responses are reproduced by the output signals of the microphones $11_1$ to $11_m$, and exactly the same signals are fed to the subtractor 190. The output signal of the subtractor 190 thus can be made zero, that is, it is possible to obtain the same howling suppression effect as in the system of the previous Embodiment 2.

In this embodiment, there is no need of making zero the sound pressures at the m microphones $11_1$ to $11_m$. Therefore, it is possible to provide a very excellent suppression of the howling phenomenon while controlling the sound pressures at the microphones $11_1$ to $11_m$ such that a person near any one of the microphones $11_1$ to $11_m$ receives the acoustic signals from the loudspeakers $1_1$ to $1_n$ with sufficient clarity. This is an important feature which can be realized only with the system according to the invention.

Incidentally, in each of the foregoing embodiments (1), (2) and (3), once all of the impulse responses between the loudspeakers $1_1$, $1_2$, ... $1_n$ and the microphones $11_1$, $11_2$, ... $11_m$ have been measured and stored in the waveform memory 60, if the arrangement of loudspeakers and their acoustic environments are never changed these microphones would not be necessary anymore and it would be possible to produce acoustic signals with desired impulse responses at the respective output points at all times.

EMBODIMENT 4

Figure 14:
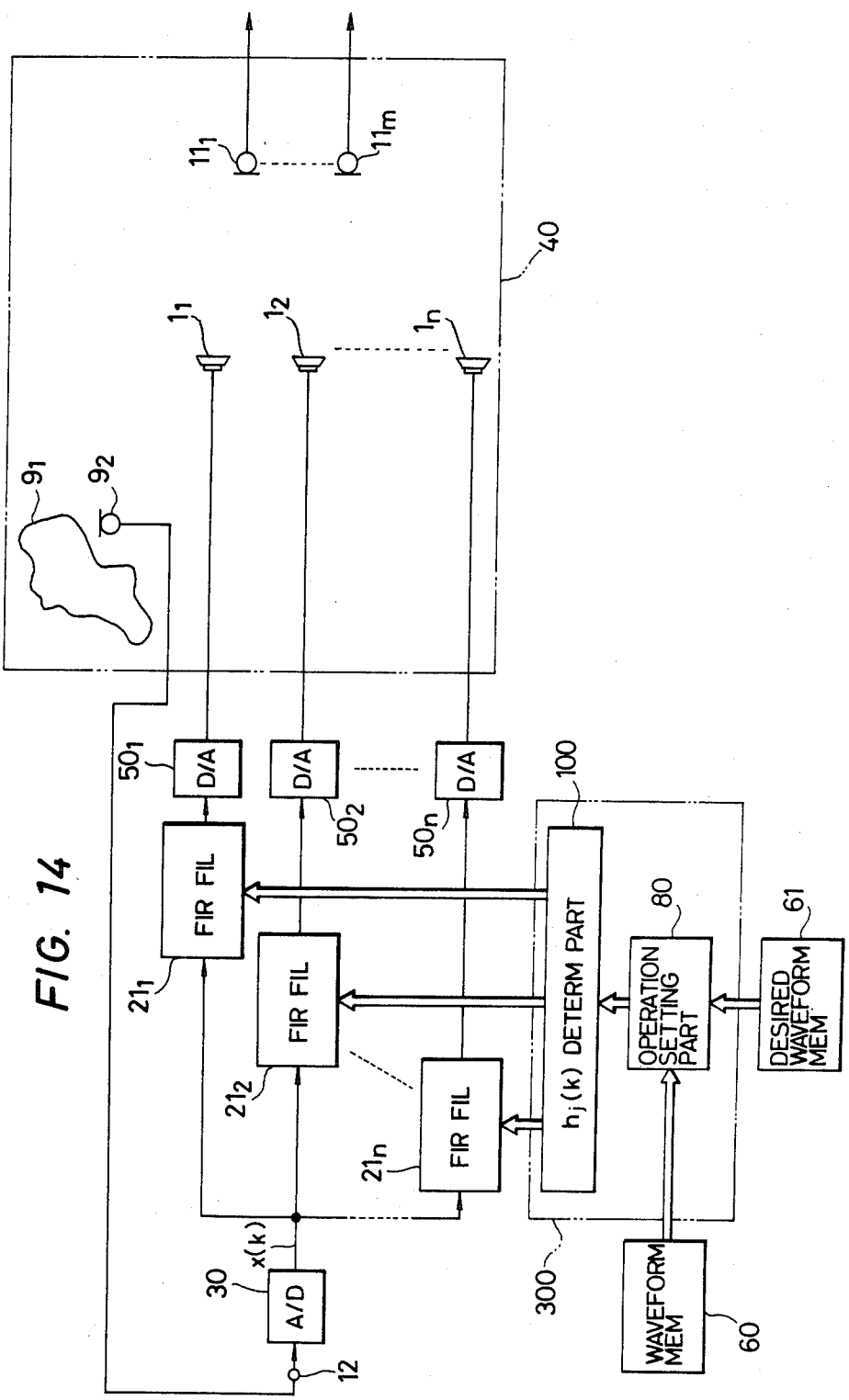
FIG. 14 is a block diagram showing an embodiment of the invention applied to a system, in which noise from a noise source is picked up by a microphone, the output of which is subjected to an inverse control before being supplied to a loudspeaker for cancellation of the noise at the position of the microphone.

FIG. 14 shows the Embodiment 4 according to the invention. In this instance, there is a noise source 91 in a room sound field 40. The room noise of the noise source 91 is received by a monitor microphone 92. An inverse control of the output of the microphone 92 is effected through FIR filters $21_1$ to $21_n$, the outputs of which are fed to loudspeakers $1_1$ to $1_n$. The filter coefficients $h_1(k)$, $h_2(k)$, ..., $h_n(k)$ of the FIR filters $21_1$ to $21_n$ are set such that the noise from the noise source 91 received by the microphones $11_1$ to $11_m$ is cancelled by the acoustic signals from the loudspeakers $1_1$ to $1_n$ at the positions of the microphones $11_1$ to $11_m$. Thus, the noise can be suppressed at the positions of the microphones $11_1$ to $11_m$.

EMBODIMENT 5

Figure 15:
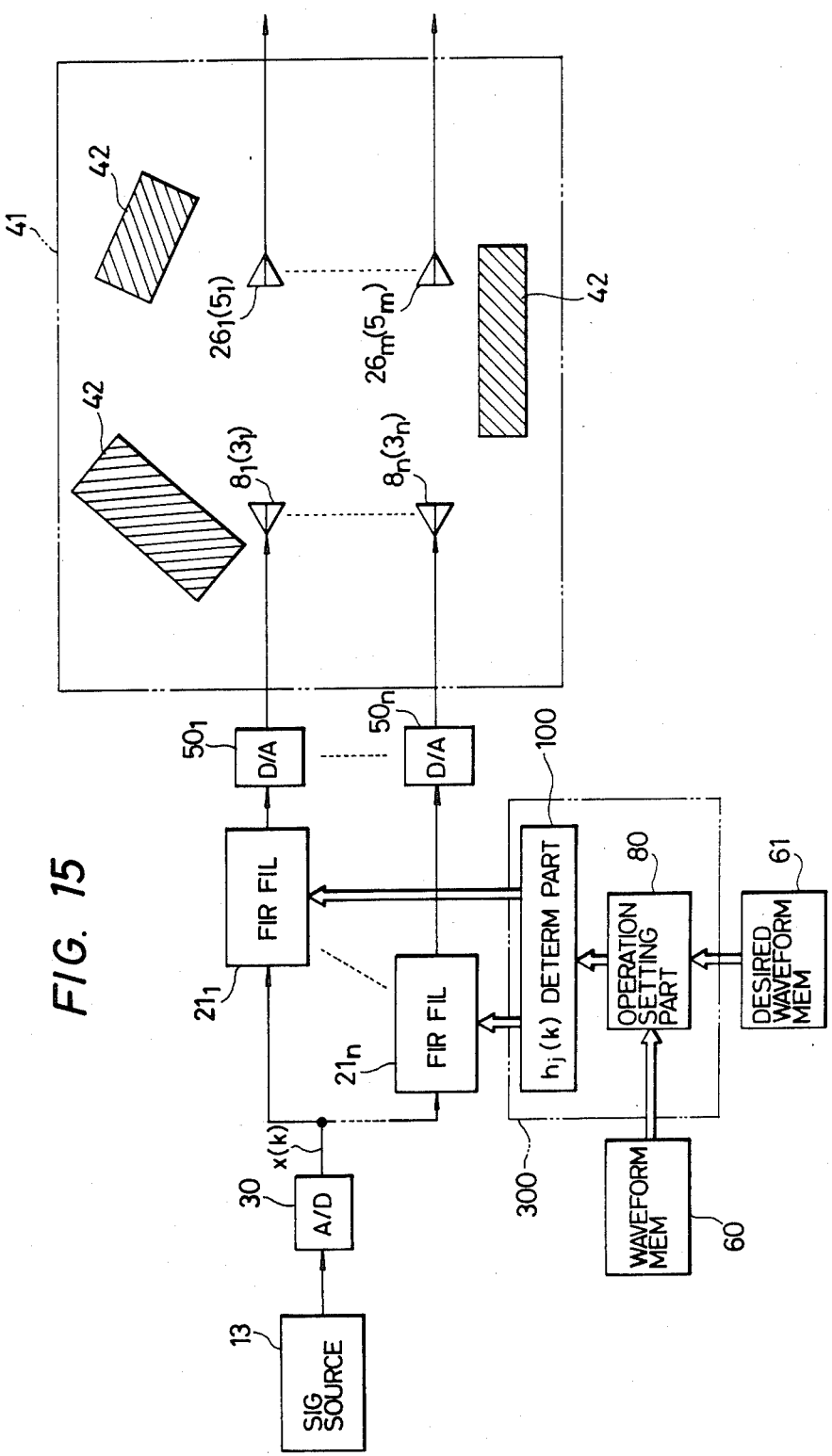
FIG. 15 is a block diagram showing an embodiment of the invention applied to an inverse control of the inputs to an n-input m-output electromagnetic wave propagation system to obtain distortionless signals from receiving antennas.

FIG. 15 shows an embodiment of the invention applied to an n-input m-output electromagnetic wave propagation system 41 as a linear FIR system. Transmitting antennas $8_1$ to $8_n$ are disposed at respective input points $3_1$ to $3_n$ of the system 41, and receiving antennas $26_1$ to $26_m$ are disposed at respective output points $5_1$ to $5_m$. The electromagnetic waves radiated from the antennas $8_1$ to $8_n$ are subject to reflection by reflectors 42 such as buildings in the electromagnetic wave propagation system 41. When both reflected and non-reflected waves are received by the antennas $26_1$ to $26_m$, signal distortions such as multi-path or ghost would occur. In this embodiment, the signal from a signal source 13 is fed to the transmitting antennas $8_1$ to $8_n$ through FIR filters $21_1$ to $21_n$. The signal thus is subjected to an inverse control through the FIR filters $21_1$ to $21_n$ such that distortionless signals are received by the receiving antennas $26_1$ to $26_m$.

EMBODIMENT 6

Figure 16:
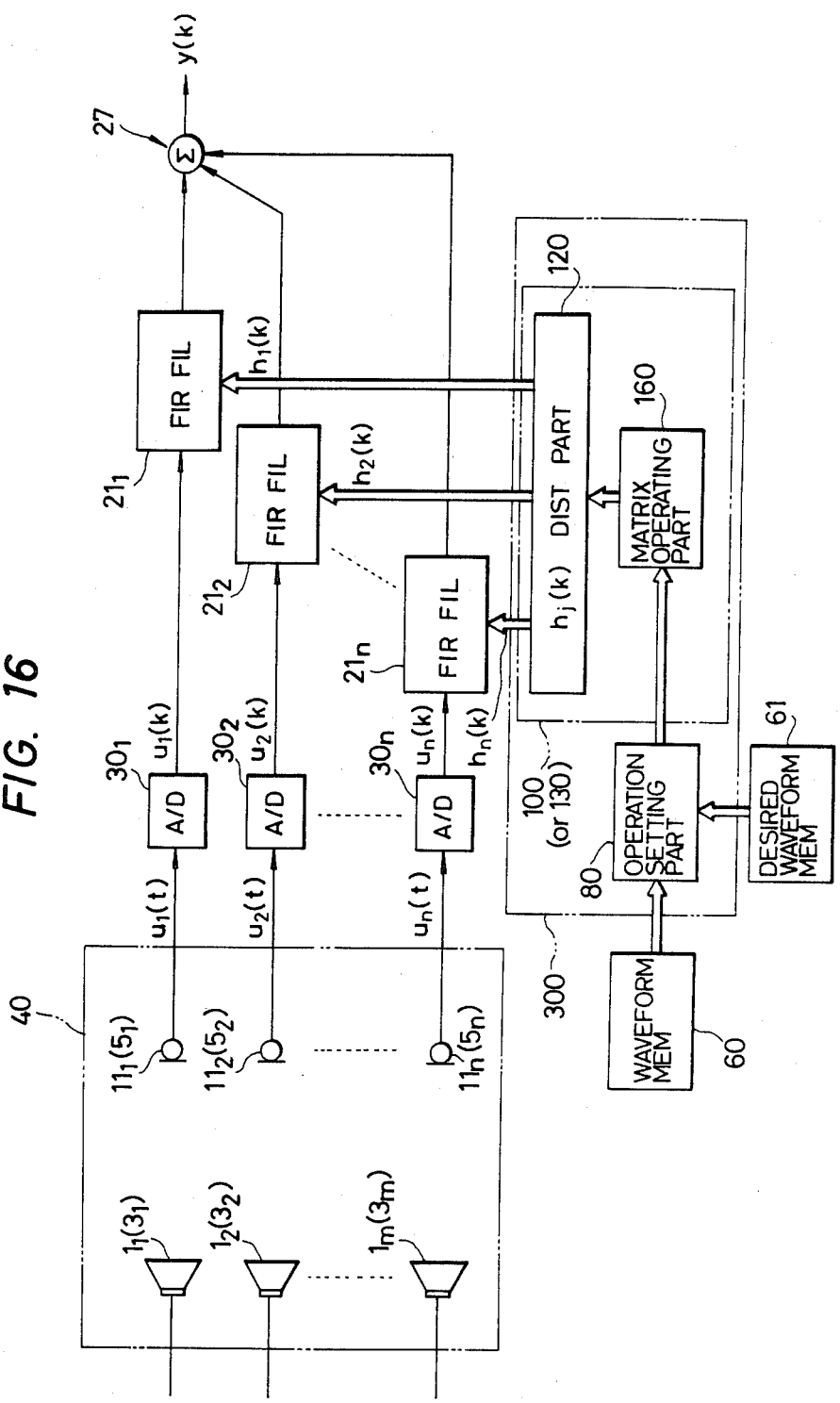
FIG. 16 is a block diagram showing an embodiment of the invention applied to an inverse control system for an m-input n-output acoustic system to obtain a distortionless signal free from noise.

FIG. 16 shows a further embodiment of the invention, in which an inverse control is effected on the output of a linear FIR system 40. A desired signal source $1_1$, which radiates a signal to be received, and noise sources $1_2$ to $1_m$ are disposed at respective m input points in a room sound field. Microphones $11_1$ to $11_n$ are disposed at n output points. The output signals $u_1(t)$ to $u_n(t)$ of the microphones $11_1$ to $11_n$ are converted through A/D converters $30_1$ to $30_n$ into discrete signals $u_1(k)$ to $u_n(k)$ (k is an integer index) which are fed to FIR filters $21_1$ to $21_n$. The outputs of the FIR filters $21_1$ to $21_n$ are added together in an adder 27 to obtain an output y(k). In a waveform memory 60 are stored m·n impulse response vectors $G_{ij}$ (i = 1, 2, ... m, j = 1, 2, ... n) of the signal transmission channels between the loudspeakers $1_1$ to $1_m$ and microphones $11_1$ to $11_n$. In a desired waveform memory 61 are stored desired impulse response vectors $R_j$ with respect to the signal transmission channels between the loudspeakers $1_1$ to $1_m$ and the output of the adder 27. The impulse response vectors and desired impulse response vectors stored in the waveform memory 60 and desired waveform memory 61, respectively, are fed to an operation setting part 80 in a coefficients setting part 300. Similar processings to those (1) to (5) in the Embodiment 1 are then effected in the operation setting part 80 to produce desired impulse response vectors R and matrices G and $G^T$ (or unit matrix E) which are supplied to a filter coefficients determining part 100. The filter coefficients determining part 100 includes a matrix operating part 160 and a coefficients distributing part 120. The matrix operating part 160 may be identical to the portion of the filter coefficients determining part 100 shown in FIG. 9 other than the coefficients distributing part 120, and it sets the filter coefficients of the FIR filters $21_1$ to $21_n$ in the manner as described above. It is possible to use the recursive filter coefficients determining part 130 shown in FIG. 11 in lieu of the filter coefficients determining part 100. In this case, by setting the desired vectors R to be $$R = (\underbrace{1\ 0 \ldots 0}\ \underbrace{0 \ldots 0})^T$$

$$w_{ij} + L_j - 1 \overset{n}{\underset{i=2}{\Sigma}} w_{ij} + L_j - 1$$

the output y(k) of the adder 27 can be made to consist of the sole intended signal not influenced by any noise from the noise sources $1_2$ to $1_m$.

Usually, there occur many reflected waves in a sound field in a room. In the prior art, directivity control is effected to avoid the influence of such reflected waves. Such a control, however, requires a very large number of microphones. With the embodiment shown in FIG. 16, a receiving system, which can provide as the output y(k) a distortionless intended signal free from reverberations, can be realized as a reduced scale system employing a reduced number of, i.e., m+1, microphones.

EMBODIMENT 7

Figure 17:
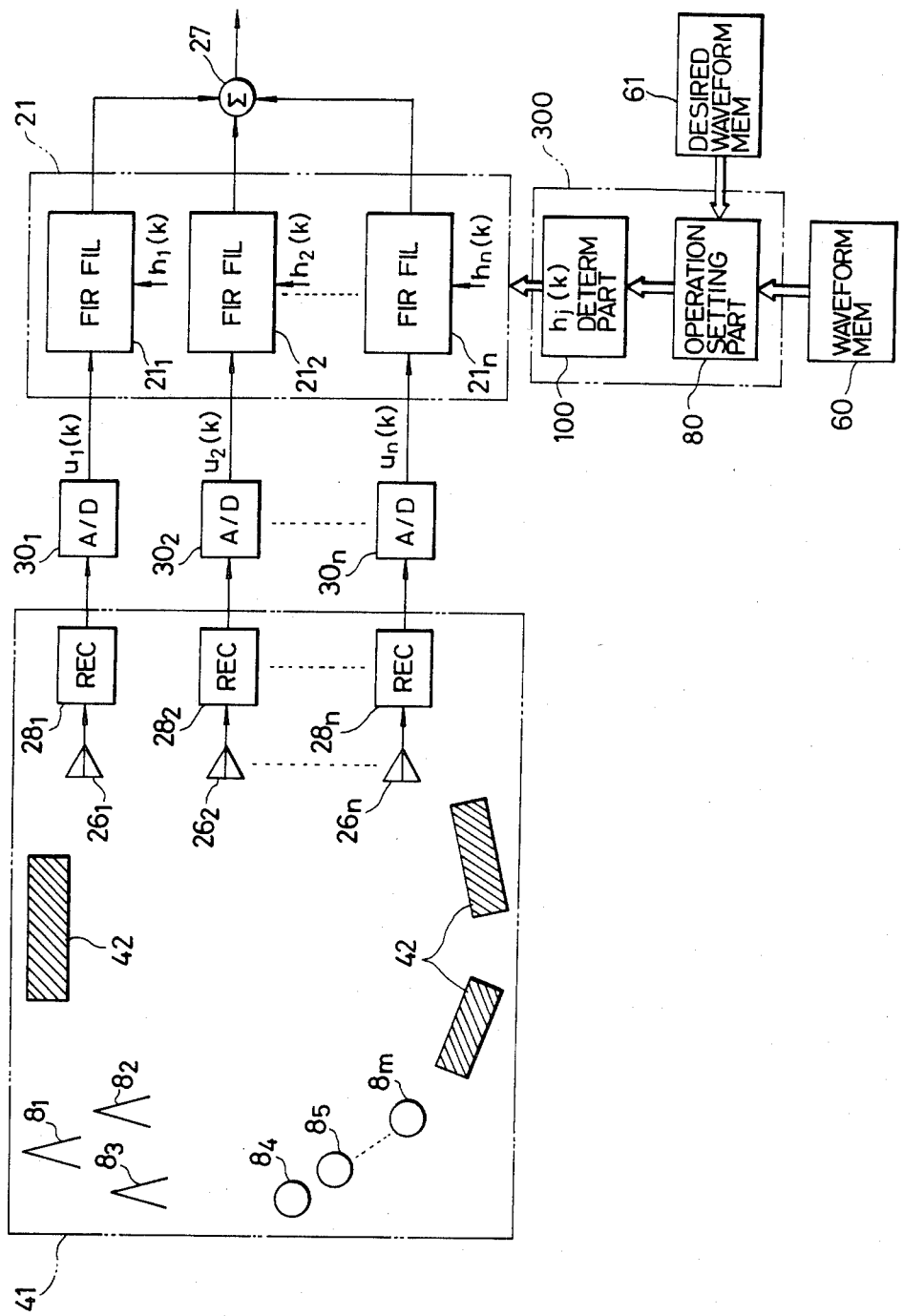
FIG. 17 is a block diagram showing an embodiment of the invention applied to an inverse control of an m-input n-output electromagnetic wave propagation system to obtain a distortionless signal free from noise.

FIG. 17 shows a further embodiment of the invention. In this instance, the invention is applied to an m-input n-output electromagnetic wave propagation system 41 as a linear FIR system. Transmitting antennas $8_1$ to $8_3$ acting as signal sources, and interference wave sources $8_4$ to $8_m$, are disposed at respective m input points of the system 41. In the system, there are reflectors 42 such as buildings. Receiving antennas $26_1$ to $26_n$ are provided at n output points. Electromagnetic waves intercepted by the receiving antennas $26_1$ to $26_n$ are coupled to receivers $28_1$ to $28_n$. The outputs of the receivers $28_1$ to $28_n$ are converted through A/D converters $30_1$ to $30_n$ into discrete signals $u_1(k)$ to $u_n(k)$ to be fed to FIR filters $21_1$ to $21_n$. The outputs of the FIR filters $21_1$ to $21_n$ are added together in an adder 27. Again in this case, by setting the desired impulse response vectors R to be $$R = (\underbrace{1\ 0\ 0 \ldots 0}\ \underbrace{0 \ldots 0})^T$$

-continued
$$w_{ij} + L_j - 1 \overset{m}{\underset{i=2}{\Sigma}} (w_{ij} + L_j - 1)$$

the sole output of the transmitting antenna $8_1$ among the transmitting antennas $8_1$ to $8_3$ can be obtained as the output of the adder 27. In other words, it is possible to select only one of the transmitted signals from the transmitting antennas $8_1$ to $8_3$ without being influenced by the other transmitted signals or interference waves. The selected transmitted wave from the transmitting antenna $8_1$ is also reflected by the reflectors 42 such as buildings, and the reflected waves are also intercepted by the receiving antennas $26_1$ to $26_n$. However, it is possible to obtain as the output of the adder 27 a distortionless signal free from ghost or multipath, i.e., an output that is not adversely affected by the reflected waves.

In addition, since it is necessary to provide only m+1 receiving antennas $26_1$ to $26_n$ ($n = m+1$), it is possible to construct a reduced scale receiving system with a reduced number of antenna elements compared to the prior art structure where the same effects are obtained through directivity control. This is particularly effective where the space factors are inferior such as places where buildings or houses are crowded.

MODIFICATION

Where the impulse responses $g_{ij}(k)$ (i = 1, 2, ... m, j = 1, 2, ... n and k is an integer index) of the linear FIR system need not be varied once they have been measured and also the desired impulse responses $r_j(k)$ (i = 1, 2, ..., m) are fixed, the waveform memory 60, desired waveform memory 61 and coefficients setting part 300 may be omitted. In this case, the filter coefficients $h_j(k)$ (j = 1, 2, ..., n) may be obtained using a separate computer and set for the FIR filters $21_1$ to $21_n$. Where the desired impulse responses $r_j(k)$ sometimes have to be varied although the impulse responses $g_{ij}(k)$ are fixed, the desired waveform memory 61 may be omitted, and every time the desired impulse responses $r_j(k)$ are to be changed, the filter coefficients may be appropriately changed using the waveform memory 60 where the impulse responses $g_{ij}(k)$ are stored. Where the impulse responses $g_{ij}(k)$ are subject to changes although the desired impulse responses $r_j(k)$ are fixed, every time the impulse responses $g_{ij}(k)$ are changed, the filter coefficients are changed by measuring the new impulse responses $g_{ij}(k)$.

The waveform memory 60 and desired waveform memory 61 may consist of magnetic disks or semiconductor memories. The coefficients setting part 300 may consist of microprocessors. The multiple-input multiple-output linear FIR system may be an n-input m-output linear FIR system. In this case, the characteristics of the output of the system can be freely controlled, and an exact control of an open loop system can be realized.

ADVANTAGES OF THE INVENTION

As has been described in the foregoing, according to the invention it is possible to realize an exact inverse control of a linear FIR system by additionally providing at least one transmitting element and at least one FIR filter in the case where FIR filters are used on the input side of the system, while additionally providing at least one receiving element and at least one FIR filter in the case where FIR filters are used on the output side of the system, i.e., by providing at least one extra signal transmission channel in the controlled system. Thus, stable performance of inverse control can be obtained with respect to different linear FIR systems.

Further, exact inverse control can be realized with $n = m + 1$, i.e., with a minimum number of transmitting or receiving elements, thus permitting reduction of the hardware scale. Further, where the desired impulse responses, which can be represented by $P_i$ discrete signals, and the number of FIR filter taps $L_j$ are determined such that $w_{ij} + L_j - 1 = P_i$ for $i = 1, 2, \ldots, m$ and $j = 1, 2, \ldots, n$, it is possible to realize an inverse control system with a minimum tap number.

The system according to the invention can produce a desired sound pressure distribution when it is applied to an acoustic system as described in connection with FIG. 8. Also, it can prevent howling phenomenon as described in connection with FIGS. 12 and 13. Further, it can remove noise as described in connection with FIG. 14.

Also, it can realize suppression of noise and removal of reverberations as described in connection with FIG. 16.

In addition, it permits distortionless transmission of a signal when it is applied to an electromagnetic wave propagation system as described in connection with FIG. 15. Further, it can remove noise, multiplex reflection waves and ghost as described in connection with FIG. 17.

EXPERIMENT

Figure 18:
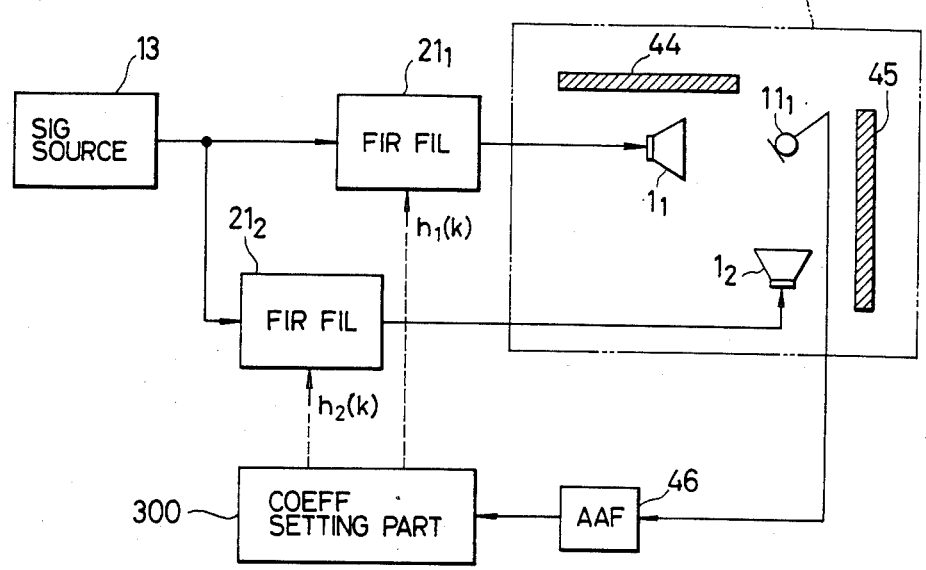
FIG. 18 is a block diagram showing an arrangement according to the invention for an experiment.

An arrangement as shown in FIG. 18 was used. More specifically, reflectors 44 and 45 were disposed substantially in an L-shaped fashion in an anechoic room 43. Loudspeakers $1_1$ and $1_2$ were disposed at distances of 40 to 60 cm from the reflectors 44 and 45, respectively. A microphone $11_1$ was disposed at a distance of 1 m from the loudspeakers $1_1$ and $1_2$. The output of the microphone $11_1$ was fed through an anti-aliasing filter (AAF) 46 to a coefficients setting part 300 consisting of a digital computer. A signal from a signal source 13 was fed through FIR filters $21_1$ and $21_2$ to the loudspeakers $1_1$ and $1_2$.

Figure 19:
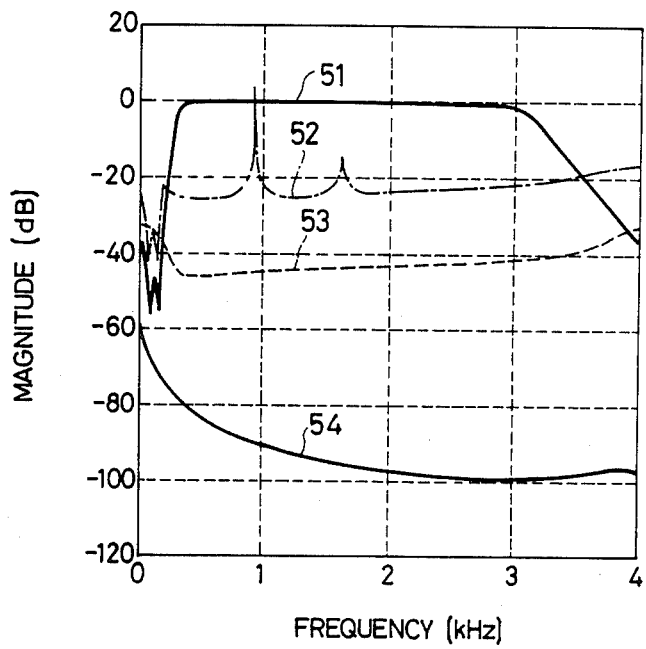
FIG. 19 is a graph showing frequency characteristics obtained as a result of the experiment.

Curve 51 in FIG. 19 shows the desired response $\delta(k)$ (which was filtered by the AAF) given by the equation (6). Curve 52 shows a frequency characteristic of error $$e_1(k) = \delta(k) - g_{11}(k) \odot h_1(k)$$

in the case where the sole filter $21_1$ was used for inverse control with the filter coefficients $h_1(k)$ determined by the prior art method using the equation (2) for the impulse response $g_{11}(k)$ between the loudspeaker $1_1$ and the microphone $11_1$. Curve 53 shows a frequency characteristic of error $$e_2(k) = \delta(k) - g_{12}(k) \odot h_2(k)$$

in the case when the sole FIR filter $21_2$ was used with the filter coefficients $h_2(k)$ determined by the same prior art method for the impulse response $g_{12}(k)$ between the loudspeaker $1_2$ and the microphone $11_1$. Curve 54 shows error $$e_m(k) = \delta(k) - \{g_{11}(k) \odot h_1(k) + g_{12}(k) \odot h_2(k)\}$$

in the case when both the FIR filters $21_1$ and $21_2$ were used with the filter coefficients $h_1(k)$ and $h_2(k)$ determined to satisfy the equation (6) according to the invention. The error $e_m(k)$ in the case of application of the invention is thought to be due to the precision of the computer used for the coefficients setting part 300. It is ascertained from the results of the experiment that the inverse control system according to the invention has very superior performance compared to the prior art systems.

We claim:

1. An inverse control system for an n-input m-output (m being 1 or a greater integer, n being an integer greater than m) linear finite impulse response (FIR) system defining n·m signal transmission channels between n input points and m output points, with n transmitting elements being disposed at the respective n input points for providing signals to said linear FIR system, wherein said inverse control system is disposed between said n transmitting elements and a common signal source for effecting an inverse control such as to provide desired impulse responses between said signal source and said m output points;

said inverse control system comprises n FIR filters disposed between said signal source and respective said n transmitting elements;

a j-th (j = 1, 2, . . . , n) one of said FIR filters connected to a j-th one of said input points through an associated one of said transmitting elements has a number $L_j$ of taps which satisfies relationships represented by $$\sum_{s=1}^{n} L_s \geq \sum_{t=1}^{m} (w_{tj} + L_j - 1) \quad (1a)$$

$$w_{ij} + L_j - 1 \geq P_i \quad (1b)$$

for all $i = 1, 2, \ldots, m$ and $j = 1, 2, \ldots, n$ where $w_{ij}$ is the number of discrete signals representing the impulse response $g_{ij}(k)$ of said signal transmission channel between said j-th input point and an i-th ($i = 1, 2, \ldots, m$) one of said m output points of said linear FIR system and $P_i$ is the number of discrete signals representing said desired impulse response $r_i(k)$ between said signal source and said i-th output point; and said j-th FIR filter having filter coefficients $h_j(k)$ ($j = 1, 2, \ldots, n$) satisfying a relationship $$r_i(k) = \sum_{j=1}^{n} g_{ij}(k) \odot h_j(k) \quad (2)$$

for all $i = 1, 2, \ldots, m$
where $\odot$ represents a discrete convolution.

2. An inverse control system for an m-input n-output (m being 1 or greater integer, n being an integer greater than m) linear finite impulse response (FIR) system defining m·n signal transmission channels between m input points and n output points, with n receiving elements being disposed at the respective n output points for receiving signals provided to said linear FIR system, wherein said inverse control system is disposed between said n receiving elements and n input terminals of adder means for effecting an inverse control such as to provide desired impulse responses between the output side of said adder means and said m input points;

said inverse control system comprises n FIR filters disposed between said n receiving elements and the n input terminals of said adder means, respectively; a j-th(j=1, 2, ..., n) one of said n FIR filters connected to a j-th one of said output points through an associated one of said receiving elements having a number $L_j$ of taps which satisfies the relationships represented by $$\sum_{s=1}^{n} L_s \geq \sum_{t=1}^{m} (w_{ij} + L_j - 1) \tag{1a}$$

$$w_{ij} + L_j - 1 \geq P_i \tag{1b}$$

for all $i=1, 2, \ldots, m$ and $j=1, 2, \ldots, n$ where $w_{ij}$ is the number of discrete signals representing the impulse response $g_{ij}(k)$ of said signal transmission channel between an i-th one of said m input points and the j-th output point of said linear FIR system and $P_i$ is the number of discrete signals representing said desired impulse response $r_i(k)$ between said i-th input point and output side of said adder means; and said j-th FIR filter having filter coefficients $h_j(k)$ satisfying a relationship $$r_i(k) = \sum_{j=1}^{n} g_{ij}(k) \circledast h_j(k) \tag{2}$$

for all $i=1, 2, \ldots, m$
where $\circledast$ represents a discrete convolution.

3. The inverse control system according to claim 1 or 2, wherein said desired impulse response $r_i(k)$ is represented by $P_i$ discrete signals satisfying a relationship $$P_i \leq w_{ij} + L_j - 1 \tag{3}$$

for all $i=1, 2, \ldots, m$ and $j=1, 2, \ldots, n$ and said j-th FIR filter has a number $L_j$ of taps satisfying a relationship $$\sum_{s=1}^{n} L_s = \sum_{t=1}^{m} (w_{ij} + L_j - 1) \tag{4}$$

for all $j=1, 2, \ldots, n$.

4. The inverse control system according to claim 1 or 2, wherein
$n = m + 1$.

5. The inverse control system according to claim 3, wherein
$n = m + 1$.

6. The inverse control system according to claim 1 or 2, which further comprises coefficients setting means for computing the filter coefficients $h_j(k)$ ($j=1, 2, \ldots, n$) satisfying the relationships (1a), (1b) and (2) by utilizing said impulse response $g_{ij}(k)$ and desired impulse response $r_i(k)$ and setting the computed filter coefficients $h_j(k)$ ($j=1, 2, \ldots, n$) for said j-th FIR filter.

7. The inverse control system according to claim 6, wherein representing the relationship (2) by an expression $$R = G \cdot H$$

said coefficients setting means computes the filter coefficients $h_j(k)$ ($j=1, 2, \ldots, n$) using a relationship $$H = G^T (G \cdot G^T)^{-1} \cdot R$$

where $$H = (H_1^T H_2^T \ldots H_n^T)^T, \; H_j = (h_j^{(1)} h_j^{(2)} \ldots h_j(L_j))^T$$

$$R = (R_1^T R_2^T \ldots R_m^T)^T, \; R_i = (r_i^{(1)} r_i^{(2)} \ldots r_i(P_i) \, 0 \ldots 0)^T$$
$$\phantom{R = (R_1^T R_2^T \ldots R_m^T)^T, \; R_i = (r_i^{(1)} r_i^{(2)} \ldots r_i(P_i)\,}\leftarrow Q \rightarrow$$

$$Q = w_{ij} + L_j - 1 - P_i$$

$$G = \begin{bmatrix} G_{11} & 0 & \cdots & G_{1n} & 0 \\ 0 & G_{11} & \cdots & 0 & G_{1n} \\ \vdots & \vdots & & \vdots & \vdots \\ G_{m1} & 0 & \cdots & G_{mn} & 0 \\ 0 & G_{m1} & \cdots & 0 & G_{mn} \end{bmatrix}$$

and $$G_{ij} = (g_{ij}^{(1)} g_{ij}^{(2)} \ldots g_{ij}(w_{ij}))^T$$

8. The inverse control system according to claim 3, which further comprises coefficients setting means for computing the filter coefficients $h_j(k)$ satisfying the relations (2), (3) and (4) by utilizing said impulse response $g_{ij}(k)$ and desired impulse response $r_i(k)$ and setting the computed filter coefficients $h_j(k)$ ($j=1, 2, \ldots, n$) for said j-th FIR filter.

9. The inverse control system according to claim 8, wherein representing the relationship (2) by an expression $$R = G \cdot H$$

said coefficients setting means computes the filter coefficients $h_j(k)$ using a relationship $$H = G^T (G \cdot G^T)^{-1} \cdot R$$

where $$H = (H_1^T H_2^T \ldots H_n^T)^T, \; H_j = (h_j^{(1)} h_j^{(2)} \ldots h_j(L_j))^T$$

$$R = (R_1^T R_2^T \ldots R_m^T)^T, \; R_i = (r_i^{(1)} r_i^{(2)} \ldots r_i(P_i) \, 0 \ldots 0)^T$$
$$\phantom{R = (R_1^T R_2^T \ldots R_m^T)^T, \; R_i = (r_i^{(1)} r_i^{(2)} \ldots r_i(P_i)\,}\leftarrow Q \rightarrow$$

$$Q = w_{ij} + L_j - 1 - P_i$$

$$G = \begin{bmatrix} G_{11} & 0 & \cdots & G_{1n} & 0 \\ 0 & G_{11} & \cdots & 0 & G_{1n} \\ \vdots & \vdots & & \vdots & \vdots \\ G_{m1} & 0 & \cdots & G_{mn} & 0 \\ 0 & G_{m1} & \cdots & 0 & G_{mn} \end{bmatrix}$$

and

-continued
$$G_{ij} = (g_{ij}^{(1)} g_{ij}^{(2)} \ldots g_{ij}(w_{ij}))^T$$

10. The inverse control system according to claim 8, wherein representing the relationship (2) by an expression $$R = G \cdot H$$

said coefficients setting means computes the filter coefficients $h_j(k)$ $(j=1, 2, \ldots, n)$ using a relation $$H = G^{-1} \cdot R$$

where $$H = (H_1^T H_2^T \ldots H_n^T)^T, \; H_j = (h_j^{(1)} h_j^{(2)} \ldots h_j(L_j))^T$$

$$R = (R_1^T R_2^T \ldots R_m^T)^T, \; R_i = (r_i^{(1)} r_i^{(2)} \ldots r_i(P_i) \, 0 \ldots 0)^T$$
$$\leftarrow Q \rightarrow$$

$$Q = w_{ij} + L_j - 1 - P_i$$

$$G = \begin{bmatrix} G_{11} \diagdown 0 & \ldots & G_{1n} \diagdown 0 \\ 0 \diagdown G_{1n} & \ldots & 0 \diagdown G_{1n} \\ \vdots & \vdots & \vdots \\ G_{m1} \diagdown 0 & \ldots & G_{mn} \diagdown 0 \\ 0 \diagdown G_{m1} & \ldots & 0 \diagdown G_{mn} \end{bmatrix}$$

and $$G_{ij} = (g_{ij}^{(1)} g_{ij}^{(2)} \ldots g_{ij}(w_{ij}))^T$$

11. The inverse control system according to claim 6, wherein said coefficients setting means computes the filter coefficients $h_j(k)$ $(j=1, 2, \ldots, n)$ satisfying the relationship (2) by a recursive computation.

12. The inverse control system according to claim 11, wherein representing the relationship (2) by an expression $$R = G \cdot H$$

said coefficients setting means performs the recursive computation expressed as $$H(q+1) = H(q) + \alpha(q) \cdot G^T \cdot (R - G \cdot H(q)) \qquad (5)$$

where q is the number of times the argorithm of the equation (5) is repeatedly executed, $\alpha(q)$ is a step size indicating an amount by which to move from H(q), and $$H = (H_1^T H_2^T \ldots H_n^T)^T, \; H_j = (h_j^{(1)} h_j^{(2)} \ldots h_j(L_j))^T$$

$$R = (R_1^T R_2^T \ldots R_m^T)^T, \; R_i = (r_i^{(1)} r_i^{(2)} \ldots r_i(P_i) \, 0 \ldots 0)^T$$
$$\leftarrow Q \rightarrow$$

$$Q = w_{ij} + L_j - 1 - P_i$$

$$G = \begin{bmatrix} G_{11} \diagdown 0 & \ldots & G_{1n} \diagdown 0 \\ 0 \diagdown G_{11} & \ldots & 0 \diagdown G_{1n} \\ \vdots & \vdots & \vdots \\ G_{m1} \diagdown 0 & \ldots & G_{mn} \diagdown 0 \\ 0 \diagdown G_{m1} & \ldots & 0 \diagdown G_{mn} \end{bmatrix}$$

and $$G_{ij} = (g_{ij}^{(1)} g_{ij}^{(2)} \ldots g_{ij}(w_{ij}))^T.$$

13. The inverse control system according to claim 8, wherein said coefficients setting means computes the filter coefficients $h_j(k)$ $(j=1, 2, \ldots, n)$ satisfying the relationship (2) through recursive computation.

14. The inverse control system according to claim 13, wherein representing the relationship (2) by an expression $$R = G \cdot H$$

said coefficients setting means performs the recursive computation expressed as $$H = (q+1) = H(q) + \alpha(q) \cdot G^T (R = G \cdot H(q)) \qquad (6)$$

where q is the number of times the argorithm of the equation (6) is repeatedly executed, $\alpha(q)$ is a step size indicating an amount by which to move from H(q), and $$H = (H_1^T H_2^T \ldots H_n^T)^T, \; H_j = (h_j^{(1)} h_j^{(2)} \ldots h_j(L_j))^T$$

$$R = (R_1^T R_2^T \ldots R_m^T)^T, \; R_i = (r_i^{(1)} r_i^{(2)} \ldots r_i(P_i) \, 0 \ldots 0)^T$$
$$\leftarrow Q \rightarrow$$

$$Q = w_{ij} + L_j - 1 - P_i$$

$$G = \begin{bmatrix} G_{11} \diagdown 0 & \ldots & G_{1n} \diagdown 0 \\ 0 \diagdown G_{11} & \ldots & 0 \diagdown G_{1n} \\ \vdots & \vdots & \vdots \\ G_{m1} \diagdown 0 & \ldots & G_{mn} \diagdown 0 \\ 0 \diagdown G_{m1} & \ldots & 0 \diagdown G_{mn} \end{bmatrix}$$

and $$G_{ij} = (g_{ij}^{(1)} g_{ij}^{(2)} \ldots g_{ij}(w_{ij}))^T.$$

15. The inverse control system according to claim 6, which further comprises a waveform memory for storing each said impulse response $g_{ij}(k)$ of said linear FIR system to be read out therefrom and supplied to said coefficients setting means.

16. The inverse control system according to claim 8, which further comprises a waveform memory for storing each said impulse response $g_{ij}(k)$ of said linear FIR system to be read out therefrom and supplied to said coefficients setting means.

17. The inverse control system according to claim 15, which further comprises a desired waveform memory for storing the desired impulse response $r_i(k)$ to be read out therefrom and supplied to said coefficients setting means.

18. The inverse control system according to claim 16, which further comprises a desired waveform memory for storing the desired impulse response $r_i(k)$ to be read out therefrom and supplied to said coefficients setting means.

19. The inverse control system according to claim 1, wherein said n transmitting elements are loudspeakers and said linear FIR system is a sound field in an ordinary room, a sound pressure distribution corresponding to said desired impulse response being realized at m point in said sound field constituting respective said output points of said linear FIR system.

20. The inverse control system according to claim 19, wherein m microphones are provided at respective said m output points in said sound field to obtain output signals therefrom, the characteristics of said output signals from said m microphones being controlled to have desired characteristics corresponding to said desired impulse response $n_i(k)$ (i=1, 2, ..., m).

21. The inverse control system according to claim 20, wherein at least one additional loudspeaker is provided and supplied with the signal from said signal source, the filter coefficients of said n FIR filters being set such as to cancel an acoustic signal radiated from said at least one additional loudspeaker and received by said m microphones, thereby removing the acoustic coupling between said at least one additional loudspeaker and said microphones.

22. The inverse control system according to claim 20, wherein an additional microphone is provided to receive room noise radiated from a noise source present in said sound field, said additional microphone constituting said signal source, the filter coefficients of said n FIR filters being set such that the acoustic signals radiated from said n loudspeakers cancel said room noise at the positions of respective said m microphones.

23. The inverse control system according to claim 1, wherein said n transmitting elements are antennas and said linear FIR system is an electromagnetic wave propagation system for transmitting electromagnetic waves, the filter coefficients of said n FIR filters being set such that the signals from said n antennas are received without distortion at m output points in said electromagnetic wave propagation system.

24. The inverse control system according to claim 2, wherein said linear FIR system is a sound field in an ordinary room, said n receiving elements are n microphones disposed at respective said n output points in said sound field, and the filter coefficients of said n FIR filters are set so that output signals from said n microphones are controlled to have desired characteristics corresponding to said desired impulse responses $r_i(k)$ (i=1, 2, ..., m), thereby allowing said adder means to produce an output free from reverberations and/or noise.

25. The inverse control system according to claim 2, wherein said linear FIR system is an electromagnetic wave propagation system for transmitting electromagnetic waves, said n receiving elements are antennas disposed at respective said n output points, and the filter coefficients of said n FIR filters are set so that the output signals from said n antennas are controlled to have desired characteristics corresponding to said desired impulse responses $r_i(k)$ (i=1, 2, ..., m), thereby allowing said adder means to produce an output free from multi-path ghost and/or noise.

* * * * *